US012385244B2

(12) United States Patent
Yehia et al.

(10) Patent No.: US 12,385,244 B2
(45) Date of Patent: Aug. 12, 2025

(54) CONCRETE STRUCTURAL SYSTEM

(71) Applicant: American University of Sharjah, Sharjah (AE)

(72) Inventors: Sherif A. Yehia, Sharjah (AE); Nasser N. Qaddoumi, Dubai (AE); Lim Nguyen, Papillion, NE (US)

(73) Assignee: American University of Sharjah, Sharjah (AE)

( * ) Notice: Subject to any disclaimer, the term of this patent is extended or adjusted under 35 U.S.C. 154(b) by 259 days.

(21) Appl. No.: 18/245,460

(22) PCT Filed: Sep. 16, 2021

(86) PCT No.: PCT/US2021/071490
§ 371 (c)(1),
(2) Date: Mar. 15, 2023

(87) PCT Pub. No.: WO2022/061360
PCT Pub. Date: Mar. 24, 2022

(65) Prior Publication Data
US 2023/0358030 A1    Nov. 9, 2023

Related U.S. Application Data

(60) Provisional application No. 63/109,283, filed on Nov. 3, 2020, provisional application No. 63/079,959, filed on Sep. 17, 2020.

(51) Int. Cl.
*E04B 1/04* (2006.01)
*C04B 14/02* (2006.01)
(Continued)

(52) U.S. Cl.
CPC ............ *E04B 1/043* (2013.01); *C04B 14/024* (2013.01); *C04B 14/48* (2013.01); *C04B 28/08* (2013.01);
(Continued)

(58) Field of Classification Search
CPC ...... E04B 1/043; E04B 1/92; E04B 2001/925; E04B 1/34321; E04C 2/04; E04C 2/52; E04C 2002/004; H05K 9/0003
See application file for complete search history.

(56) References Cited

U.S. PATENT DOCUMENTS 2,720,105 A * 10/1955 Billups ..................... G21F 3/04
376/288
2,942,115 A *  6/1960 O'Connell ............... G21F 3/04
250/517.1
(Continued)

OTHER PUBLICATIONS

Search Report and Written Opinion received in International Application No. PCT/US2021/071490, dated Mar. 11, 2022.
(Continued)

*Primary Examiner* — Rodney Mintz
(74) *Attorney, Agent, or Firm* — Knobbe Martens Olson & Bear LLP

(57) ABSTRACT

In some implementations, a conductive concrete composition for providing improved shielding against electromagnetic radiation comprises cement, one or more supplementary materials, aggregates, one or more carbon products, and fibers. In some implementations, the composition comprises between about 5% and about 40% by weight of cement, between about 1% and about 20% by weight of one or more supplementary materials, between about 5% and about 80% by weight of aggregates, between about 1% and about 40% by weight of one or more carbon products, and between about 1% and about 10% by weight of fibers. In some embodiments, the one or more supplementary materials comprises ground granulated blast furnace slag (GGBS), the one or more carbon products comprises graphite, and the fibers comprise steel fibers. The aggregates can include normal weight, lightweight, and/or fine aggregates.

15 Claims, 9 Drawing Sheets

(51) Int. Cl.
*C04B 14/48* (2006.01)
*C04B 28/08* (2006.01)
*C04B 111/00* (2006.01)
*C04B 111/94* (2006.01)
*E04B 1/92* (2006.01)

(52) U.S. Cl.
CPC ....... *E04B 1/92* (2013.01); *C04B 2111/00258* (2013.01); *C04B 2111/94* (2013.01); *E04B 2001/925* (2013.01)

(56) References Cited

U.S. PATENT DOCUMENTS

| | | | | |
|---|---|---|---|---|
| 3,732,653 | A * | 5/1973 | Pickett | E04H 17/16 256/26 |
| 3,732,831 | A * | 5/1973 | Marciniak | E05G 1/024 109/82 |
| 3,995,165 | A * | 11/1976 | Buth | G21F 3/04 976/DIG. 335 |
| 4,290,246 | A * | 9/1981 | Hilsey | E04H 3/00 D25/19 |
| 4,559,881 | A * | 12/1985 | Lankard | E04C 2/06 106/644 |
| 4,890,083 | A * | 12/1989 | Trenkler | H01B 11/1008 335/304 |
| 4,945,362 | A * | 7/1990 | Keiser | H01Q 17/007 343/912 |
| 5,241,573 | A * | 8/1993 | Thacker | G21F 3/04 250/517.1 |
| 5,447,564 | A | 9/1995 | Xie et al. | |
| 5,633,508 | A * | 5/1997 | Schleppenbach | G21F 3/04 250/517.1 |
| 5,852,643 | A * | 12/1998 | Copson | G21F 5/005 250/517.1 |
| 6,058,672 | A * | 5/2000 | McClellan | E04B 1/043 52/592.1 |
| 6,418,686 | B1 * | 7/2002 | Record | E04C 2/288 52/412 |
| 6,825,444 | B1 | 11/2004 | Tuan et al. | |
| 7,666,258 | B2 | 2/2010 | Guevara et al. | |
| 8,950,149 | B2 * | 2/2015 | Stahl | E04B 1/043 52/592.2 |
| 8,968,461 | B1 | 3/2015 | Tuan et al. | |
| 9,278,887 | B1 * | 3/2016 | Tuan | C04B 40/001 |
| 9,681,592 | B2 | 6/2017 | Tuan et al. | |
| 10,034,418 | B1 | 7/2018 | Tuan et al. | |
| 10,256,006 | B1 | 4/2019 | Tuan et al. | |
| 11,479,960 | B1 * | 10/2022 | Weller | E04B 1/043 |
| 11,665,870 | B2 * | 5/2023 | Cordes | B32B 3/12 174/379 |
| 11,956,934 | B2 * | 4/2024 | Nguyen | E04B 1/04 |
| 2003/0198800 | A1 * | 10/2003 | Hoffman | H05K 9/0003 428/323 |
| 2006/0179757 | A1 * | 8/2006 | Schulner | E04B 7/20 52/459 |
| 2006/0201090 | A1 * | 9/2006 | Guevara | C04B 16/08 52/309.12 |
| 2012/0017520 | A1 * | 1/2012 | Hur | E04H 9/021 52/79.11 |
| 2013/0305630 | A1 * | 11/2013 | Heemskerk | E04H 17/1404 52/79.13 |
| 2013/0312358 | A1 * | 11/2013 | Stahl | E04C 2/38 52/604 |
| 2016/0234977 | A1 * | 8/2016 | Tuan | B28B 23/02 |
| 2018/0142460 | A1 * | 5/2018 | Gaudio | E04B 1/02 |
| 2018/0258659 | A1 * | 9/2018 | LeBlanc | E04B 7/20 |
| 2019/0029147 | A1 * | 1/2019 | Cordes | B32B 15/085 |
| 2019/0124800 | A1 * | 4/2019 | Bodi | E04C 2/292 |
| 2019/0316294 | A1 * | 10/2019 | Medoff | C10G 1/02 |
| 2021/0161035 | A1 * | 5/2021 | Nguyen | E04B 1/04 |
| 2024/0147680 | A1 * | 5/2024 | Yehia | C04B 18/146 |

OTHER PUBLICATIONS

Yehia, Sherif, et al. "Conductive Concrete for Electromagnetic Shielding Applications," Advances in Civil Engineering Materials, vol. 3, No. 1, 2014, pp. 270-290, doi:10.1520/ACEM20130107. ISSN 2165-3984.

Khalid, Tuqa, et al. "Feasibility Study of Using Electrically Conductive Concrete for Electromagnetic Shielding Applications as a Substitute for Carbon-laced Polyurethane Absorbers in Anechoic Chambers." IEEE Transactions on Antennas and Propagation, vol. 65, Issue 5, May 2017. https://ieeexplore.ieee.org/document/7857757.

Swaked, Bassam, et al. "Conductive Concrete for Smart Cities Applications." 2019 AEIT International Annual Conference (AEIT), IEEE, Nov. 7, 2019. https://ieeexplore.ieee.org/document/8893415.

Swaked, Bassam, et al. "Conductive Concrete for Smart Cities Applications", 111th AEIT International Annual Conference, Firenze, Italy, Sep. 20, 2019, in 22 pages.

* cited by examiner

CONCRETE STRUCTURAL SYSTEM

INCORPORATION BY REFERENCE TO ANY PRIORITY APPLICATIONS

This application claims the benefit of priority under 35 U.S.C. § 119(e) to U.S. Provisional Application No. 63/079,959, entitled "CONDUCTIVE CONCRETE COMPOSITIONS FOR INFRASTRUCTURE APPLICATIONS", filed Sep. 17, 2020, and U.S. Provisional Application No. 63/109,283, entitled "PRECAST CONCRETE PANELS FOR ELECTROMAGNETIC SHIELDING APPLICATIONS", filed Nov. 3, 2020. All of the above-mentioned applications are hereby incorporated by reference herein in their entireties.

FIELD

The present disclosure generally relates to conductive concrete compositions for infrastructure and other applications. The present disclosure also generally relates to structures and structural components for electromagnetic shielding and other applications.

BACKGROUND

Electromagnetic interference (EMI) and electromagnetic pulse (EMP) events continue to present a significant concern with regard to critical infrastructure facilities as the amount of electromagnetic emissions from various sources grows. Protecting critical infrastructure facilities such as those associated with an electric grids/networks, data centers, and communication channels is crucial given that the failure of such facilities could threaten the well-being and proper functioning of society. While utilized in various infrastructure applications, conventional concrete compositions have limited electrical conductivity and are generally very limited in their ability to effectively provide electromagnetic shielding.

Traditional methods for shielding critical infrastructure facilitates and components from EMI and EMP events typically involve metallic structures such as six-sided steel panel enclosures or wire mesh Faraday cages. However, such metallic structures are costly to construct and maintain, and such structures are not practical for large facilities or components which require electromagnetic shielding. Such metallic structures are also typically limited in their ability to support design loads. In some situations, concrete structures and/or concrete components of structures that are pre-manufactured prior to delivery and installed on a construction site ("precast") may not provide adequate electromagnetic shielding at or around points or regions where such components are connected, for example, at ends or corners of the structures.

SUMMARY

Given the usefulness and practicality of concrete as a building product in many critical infrastructure facilities, there is a need for concrete compositions that can provide electromagnetic shielding. There is also a need for concrete compositions that can protect against corrosion of steel reinforcement and reduce negative impacts arising from static electricity. Additionally, there is a need for concrete structures and concrete structural components that are designed and/or assembled to prevent or minimize leakage of electromagnetic waves at connection points or regions within the structures.

The present disclosure provides conductive concrete compositions which exhibit unexpectedly high electromagnetic shielding characteristics and provide anti-static flooring and cathodic protection, while also exhibiting improved strength and durability characteristics critical for many structural applications. Such compositions can be utilized in a variety of infrastructure applications where concrete serves as the building and/or structural component. For example, the compositions described herein can be utilized in foundations, slabs, walls, columns, beams/girders, and/or other types of structural elements in buildings or other structures.

The present disclosure also provides concrete structures and/or components thereof (such as precast concrete panels) that are designed and/or assembled to prevent or minimize leakage of electromagnetic waves at connection points or regions within structures that are used to enclose critical infrastructure facilities or enclosure electromagnetic wave-generating components. In some implementations and as discussed further below, portions of precast concrete panels can be sized and/or shaped to interlock with portions of adjacent precast concrete panels and/or other structural components (for example, columns or other precast concrete panels) in order to minimize potential leakage of electromagnetic waves at connection and/or corner regions of the structure formed by such panels/components. For example, as discussed further below, the disclosed structures and/or structural components include interlocking portions at and/or near connection joints/regions which prevent or minimize such leakage of electromagnetic waves.

Disclosed herein is a conductive concrete composition for providing improved shielding against electromagnetic radiation, the composition comprising: between about 5% and about 40% by weight of cement; between about 1% and about 20% by weight of one or more supplementary materials; between about 5% and about 80% by weight of aggregates; between about 1% and about 40% by weight of one or more carbon products; and between about 1% and about 10% by weight of fibers.

In some implementations, said composition comprises between about 5% and about 25% by weight of said cement. In some implementations, said composition comprises between about 8% and about 20% by weight of said cement. In some implementations, said composition comprises between about 1% and about 10% of said one or more supplementary materials. In some implementations, said composition comprises between about 1% and about 5% by weight of said fibers. In some implementations, said composition comprises about 2% by weight of said fibers. In some implementations, said aggregates comprises normal weight aggregate, lightweight aggregate, and fine aggregates, and wherein said composition comprises: between about 1% and about 50% by weight of said normal weight aggregate; between about 1% and about 50% by weight of said lightweight aggregate; and between about 5% and about 40% by weight of said fine aggregate. In some implementations, said composition comprises: between about 1% and about 40% by weight of said normal weight aggregate; between about 1% and about 40% by weight of said lightweight aggregate; and between about 15% and about 25% by weight of said fine aggregate. In some implementations, said normal weight aggregate comprises limestone. In some implementations, said lightweight aggregate comprises pumice. In some implementations, said normal weight aggregate comprises a nominal size of between about 5 mm and about 20 mm. In some implementations, said nominal size is between about 8 mm and about 12 mm. In some implementations, said lightweight aggregate comprises a nominal size of between about 2 mm and about 10 mm. In some implementations, said nominal size is between about 4 mm and about 8 mm.

In some implementations, said one or more supplementary materials comprises at least one of fly ash, silica fume, and ground granulated blast furnace slag (GGBS). In some implementations, said one or more supplementary materials comprises ground granulated blast furnace slag (GGBS). In some implementations, said one or more supplementary materials comprises only ground granulated blast furnace slag (GGBS). In some implementations, said one or more supplementary materials does not comprise fly ash. In some implementations, said one or more supplementary materials does not comprise silica fume.

In some implementations, said fibers comprise a metallic material. In some implementations, said metallic material comprises steel. In some implementations, said one or more carbon products comprises graphite. In some implementations, said one or more carbon products comprises only graphite.

Disclosed herein is a conductive concrete composition for providing improved shielding against electromagnetic radiation, the composition comprising: between about 5% and about 40% by weight of cement; between about 1% and about 20% by weight of ground granulated blast furnace slag (GGBS); between about 1% and about 40% by weight of said normal weight aggregate; between about 1% and about 40% by weight of said lightweight aggregate; between about 15% and about 25% by weight of said fine aggregate; between about 1% and about 25% by weight of one or more carbon products; and between about 1% and about 5% by weight of steel fibers.

In some implementations, said composition comprises between about 5% and about 25% by weight of said cement. In some implementations, said composition comprises between about 8% and about 20% by weight of said cement. In some implementations, said composition comprises between about 1% and about 10% by weight of said ground granulated blast furnace slag (GGBS). In some implementations, said composition comprises at least one of fly ash and silica fume. In some implementations, said composition does not comprise fly ash. In some implementations, said composition does not comprise silica fume. In some implementations, said composition comprises about 2% by weight of said steel fibers. In some implementations, said one or more carbon products comprises graphite. In some implementations, said one or more carbon products comprises only graphite. In some implementations, said normal weight aggregate comprises limestone. In some implementations, said lightweight aggregate comprises pumice. In some implementations, said fine aggregate comprises sand.

In some aspects of the disclosure, a conductive concrete composition comprises: between about 5% and about 40% by weight of cement; between about 0% and about 20% by weight of one or more supplementary cementitious materials selected from the group consisting of fly ash, silica fume, and GGBS; between about 0% and about 50% by weight of normal weight aggregate; between about 0% and about 50% by weight of lightweight aggregate; between about 5% and about 40% by weight of fine aggregate; between about 0% and about 25% by weight of carbon graphite products; and between about 1% and about 5% by weight of steel fiber. In some implementations, the one or more supplementary cementitious materials comprises GGBS.

In some aspects of the disclosure, a conductive concrete composition comprises: between about 9% and about 19% by weight of cement; between about 0% and about 10% by weight of one or more supplementary cementitious materials selected from the group consisting of fly ash, silica fume, and GGBS; between about 0% and about 40% by weight of normal weight aggregate; between about 0% and about 40% by weight of lightweight aggregate; between about 15% and about 25% by weight of fine aggregate; between about 0% and about 25% by weight of carbon graphite products; and about 2% by weight of steel fiber. In some implementations, the one or more supplementary cementitious materials comprises GGBS.

As discussed further below, at least some implementations of the disclosed structural systems and/or components include metallic plates (for example, steel plates) that surround portions of precast concrete panels and/or structural components at and/or near structural connection points or regions which provide additional protection against leakage of electromagnetic waves. The concrete structures and components discussed herein can also provide grounding (and lightning protection) and can dissipate energy of EMP-induced currents. In contrast to some traditional electromagnetic absorption materials and techniques which require a separate structural support system to support design loads, the concrete structures and components discussed herein can provide electromagnetic shielding and support for structural design loads simultaneously. Additionally, such concrete structures and components can be produced in varying sizes and/or shapes depending on the application.

In certain aspects of the disclosure, a concrete structural system configured to provide electromagnetic shielding can comprise: a first structural component, the first structural component comprising a precast concrete panel including a first end, a second end opposite the first end, a first length extending between the first and second ends, a first height, and a first interlocking portion at the first end and extending along at least a portion of the first height; a second structural component, the second structural component comprising concrete and further comprising a third end, a second height, and a second interlocking portion at the third end and extending along at least a portion of the second height. In some embodiments, the first structural component and the second structural component each are formed from a conductive concrete composition. In some embodiments, the first interlocking portion of the first structural component and the second interlocking portion of the second structural component are configured to interlock with one another to minimize leakage of electromagnetic waves between the first end of the first structural component and the third end of the second structural component.

In some embodiments: the first interlocking portion of the first structural component comprises a first key extending outward from the first end and extending along the first height of the first structural component; the second interlocking portion comprises a second key and a third key spaced from the second key by a gap, the second and third keys extending outward from the third end and extending along the second height of the second structural component; and the first key is sized and shaped to fit within the gap between the second and third keys of the second structural component.

In some embodiments, the first key is spaced inward from opposite sides of the first structural component at the first end, said opposite sides extending parallel to one another along the first height of the first structural component. In some embodiments, when the first key is positioned within the gap, the second and third keys sandwich the first key. In some embodiments, the concrete structural system further comprises a plurality of rods and wherein: the first key comprises a first plurality of openings extending through a first width of the first key, the first plurality of openings vertically spaced apart along the first height of the first structural component; the second key comprises a second plurality of openings extending through a second width of the second key, the second plurality of openings vertically spaced apart along the second height of the second structural component; the third key comprises a third plurality of openings extending through a third width of the third key, the third plurality of openings vertically spaced apart along the second height of the second structural component, the third plurality of openings aligned with the second plurality of openings; when the first key is positioned within the gap between the second and third keys, the first plurality of openings align with the second and third plurality of openings and the plurality of rods are configured to extend through the first, second, and third plurality of openings and secure the first key to the second and third keys.

In some embodiments, each of the plurality of rods comprises a threaded steel rod. In some embodiments, the concrete structural system further comprises a plurality of plates secured to the first and second interlocking portions at least partially between the first key of the first interlocking portion and the second and third keys of the second interlocking portion. In some embodiments, when the first key is positioned within the gap, the plurality of plates are sandwiched between adjacent surfaces of the first key and the second and third keys. In some embodiments, each of the plurality of plates comprise a metallic material. In some embodiments, the metallic material comprises steel. In some embodiments, the plurality of plates extend along the first and second heights of the first and second structural components and surround the first and second interlocking portions. In some embodiments, each of the plurality of plates are straight and are joined together to form a unitary plate. In some embodiments, the plurality of plates are integrally formed. In some embodiments, the plurality of plates are secured to the first and second structural components with a plurality of anchors. In some embodiments, each of the plurality of anchors comprise steel. In some embodiments, the plurality of plates are secured to the first key, the second key, and the third key with the plurality of anchors.

In some embodiments, the concrete structural system further comprises a plurality of rods and wherein: the first key comprises a first plurality of openings extending through a first width of the first key, the first plurality of openings vertically spaced apart along the first height of the first structural component; the second key comprises a second plurality of openings extending through a second width of the second key, the second plurality of openings vertically spaced apart along the second height of the second structural component; the third key comprises a third plurality of openings extending through a third width of the third key, the third plurality of openings vertically spaced apart along the third height of the second structural component, the third plurality of openings aligned with the second plurality of openings; the plurality of plates comprises a fourth height and a fourth plurality of openings vertically spaced apart along the fourth height; and when the first key is positioned within the gap between the second and third keys, the first plurality of openings align with the second, third, and fourth plurality of openings and the plurality of rods are configured to extend through the first, second, third, and fourth plurality of openings and secure the first key, second key, third key, and plurality of plates to one another.

In some embodiments, the first end of the first structural component and the third end of the second structural component each comprise a plurality of vertical rebar extending vertically along the first and second heights of the first and second structural components and horizontally spaced from one another. In some embodiments, the first end of the first structural component and the third end of the second structural component each comprise a plurality of horizontal rebar extending horizontally along a portion of the first and second lengths of the first and second structural components and vertically spaced from one another along the first and second heights of the first and second structural components. In some embodiments, the plurality of vertical rebar and the plurality of horizontal rebar comprise steel.

In some embodiments, the first structural component comprises an intermediate portion between the first and second ends of the first structural component, and wherein the first and second ends comprise a first width and the intermediate portion comprises a second width that is less than the first width. In some embodiments, the first structural component gradually transitions from the first width to the second width.

In some embodiments, the second structural component comprises a precast concrete panel including the third end, a fourth end opposite the third end, a second length extending between the third and fourth ends of the second structural component. In some embodiments, the second structural component comprises a precast concrete column. In some embodiments, the first end of the first structural component comprises a first width and the third end of the second structural components comprises a second width, and wherein the first and second widths are equal.

In some embodiments: the second interlocking portion of the second structural component comprises a channel recessed from a surface of the third end of the second structural component; the first interlocking portion of the first structural component comprises the first end of the first structural component; and the channel is sized and shaped to receive at least a portion of the first end of the first structural component. In some embodiments, the channel comprises a first side, a second side opposite and parallel to the first side, and a third side connecting the first and second sides and perpendicular to both of the first and second sides.

In certain aspects of the disclosure, a method of assembling a concrete structural system comprises: obtaining a first structural component, the first structural component comprising a precast concrete panel including a first end, a second end opposite the first end, a first length extending between the first and second ends, a first height, and a first interlocking portion at the first end and extending along at least a portion of the first height, wherein the precast concrete panel is formed from a conductive concrete composition; obtaining a second structural component, the second structural component comprising a conductive concrete composition and further comprising a third end, a second height, and a second interlocking portion at the third end and extending along at least a portion of the second height; and positioning the first interlocking portion of the first structural component adjacent to the second interlocking portion of the second structural component to minimize leakage of electromagnetic waves between the first end of the first structural component and the third end of the second structural component.

In some embodiments: the first interlocking portion of the first structural component comprises a first key extending outward from the first end and along the first height of the first structural component; the second interlocking portion comprises a second key and a third key spaced from the second key by a gap, the second and third keys extending outward from the third end and along the second height of the second structural component; and said positioning the first interlocking portion of the first structural component adjacent to the second interlocking portion of the second structural component comprises positioning the first key within the gap between the second and third keys of the second structural component.

In some embodiments: the first key comprises a first plurality of openings extending through a first width of the first key, the first plurality of openings vertically spaced apart along the first height of the first structural component; the second key comprises a second plurality of openings extending through a second width of the second key, the second plurality of openings vertically spaced apart along the second height of the second structural component; the third key comprises a third plurality of openings extending through a third width of the third key, the third plurality of openings vertically spaced apart along the second height of the second structural component, the third plurality of openings aligned with the second plurality of openings; and the method further comprises: aligning the first plurality of openings with the second and third plurality of openings; and inserting a plurality of rods through the first, second, and third plurality of openings and securing the first, second, and third keys with the plurality of rods.

In some embodiments, the method further comprises aligning a fourth plurality of openings of a plurality of plates with the first, second, and third plurality of openings of the first, second, and third keys prior to the step of inserting the plurality of rods through the first, second, and third plurality of openings and securing the first, second, and third keys with the plurality of rods. In some embodiments: the second interlocking portion of the second structural component comprises a channel recessed from a surface of the third end of the second structural component; the first interlocking portion of the first structural component comprises the first end of the first structural component; the channel is sized and shaped to receive at least a portion of the first end of the first structural component; and said positioning the first interlocking portion of the first structural component adjacent to the second interlocking portion of the second structural component comprises positioning the first end of the first structural component within the channel of the second structural component.

In some embodiments, the channel comprises a first side, a second side opposite and parallel to the first side, and a third side connecting the first and second sides and perpendicular to both of the first and second sides, and wherein said positioning the first end of the first structural component within the channel of the second structural component comprises positioning the first end proximate the third side of the channel and in between the first and second sides of the channel. In certain aspects of the disclosure, a precast concrete panel for use in a concrete structure configured to provide electromagnetic shielding comprises: a first end; a second end opposite the first end; a length extending between the first and second ends; a height; at least one key extending outward from the first end and extending along at least a portion of the height; and a plurality of plates secured to the at least one key, the plurality of plates extending along the at least the portion of the height and surrounding surfaces of the at least one key; wherein the precast concrete panel is formed from a conductive concrete composition.

In some embodiments: the first end comprises a first side, a second side opposite and parallel to the first side, and a third side connected to the first and second side; the at least one key extends outward from the third side, the at least one key comprising a fourth side, a fifth side opposite and parallel to the fourth side, and a sixth side connected to the fourth and fifth side; and the plurality of plates extend along at least a portion of the first side, at least a portion of the second side, the third side, the fourth side, the fifth side, and the sixth side. In some embodiments, the plurality of plates comprise steel. In some embodiments, each of the plurality of plates are straight and are joined together to form a unitary plate. In some embodiments, the plurality of plates are integrally formed. In some embodiments, the precast concrete panel further comprises a plurality of anchors secured to the plurality of plates and to the at least one key and the first end. In some embodiments, the plurality of anchors comprise steel. In some embodiments, the at least one key comprises a plurality of openings extending through a width of the at least one key, the plurality of openings vertically spaced apart along the height. In some embodiments, the plurality of openings of the at least one key each comprise a circular cross-section. In some embodiments, the at least one key comprises a first key and a second key spaced from the first key by a gap, the first and second keys extending outward from the first end and along the height.

BRIEF DESCRIPTION OF THE DRAWINGS

Certain embodiments will be discussed in detail with reference to the following figures, wherein like reference numerals refer to similar features throughout. These figures are provided for illustrative purposes and the embodiments are not limited to the specific implementations illustrated in the figures.

DETAILED DESCRIPTION

Figure 1:
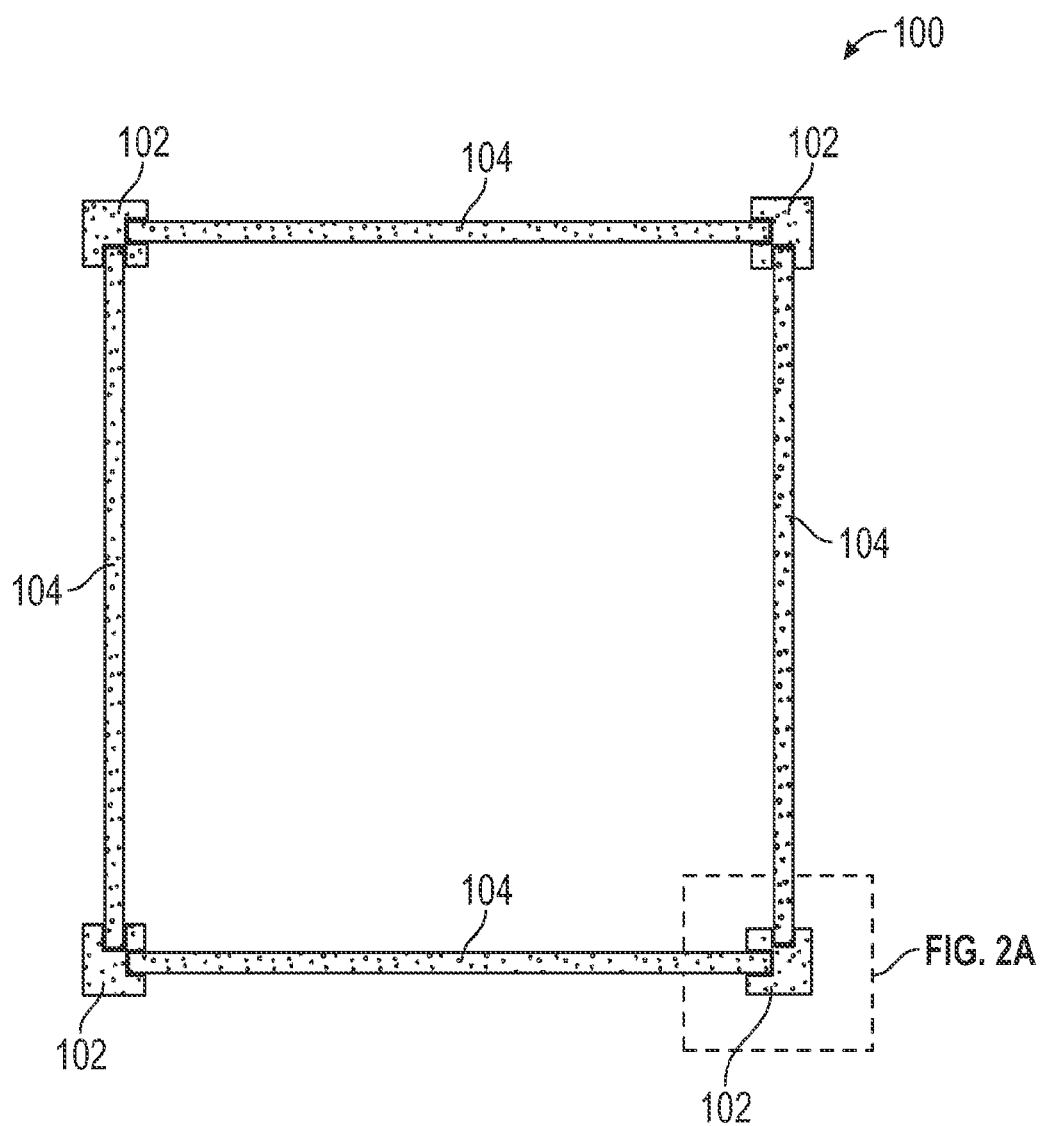
FIG. 1 illustrates a plan view of an exemplary structure in accordance with aspects of this disclosure.

As mentioned previously, the present disclosure provides conductive concrete compositions which exhibit unexpectedly high electromagnetic shielding characteristics and provide anti-static flooring and cathodic protection, while also exhibiting improved strength and durability characteristics critical for many structural applications. Such compositions can be utilized in a variety of infrastructure applications where concrete serves as the building and/or structural component.

Various embodiments of the conductive concrete compositions disclosed herein can incorporate metallic conductive materials and/or conductive carbon products. Various embodiments of the conductive concrete compositions discussed herein can incorporate supplementary materials, for example, supplementary cementitious materials such as silica fume, fly ash, and/or ground granulated blast furnace slag (GGBS). Various embodiments of the conductive concrete compositions discussed herein can incorporate conductive materials such as carbon products (for example, carbon powder) and/or fibers comprising, for example, metallic material (such as steel). Such components can accompany other elements in the conductive concrete compositions disclosed herein, such as: cement (for example, Portland Cement of various types); coarse aggregates (normal and/or lightweight aggregates, for example); fine aggregates (for example, sand and/or gravel); water; among other elements.

Advantageously, embodiments of the disclosed compositions have been found to exhibit significantly less decay as to beneficial electrical properties over time. For example, some embodiments of the disclosed compositions including one or more carbon products, GGBS, and fibers (for example, steel fibers) exhibit and maintain low resistance properties over time in comparison to cement-only mixtures and/or other concrete mixtures that include fly ash and/or silica fume (for example, instead of GGBS). Low resistance can be advantageous in that it allows the concrete (for example, the finished and/or hardened concrete) to better absorb electromagnetic waves for electromagnetic shielding applications such as those described herein. The concrete compositions disclosed herein can be incorporated into various structural applications in which they are utilized alongside steel reinforcement. In some aspects, the disclosed conductive concrete composition can be similar or identical to those described in B. Swaked, N. Qaddoumi, S. Yehia, S. Farhana, and L. Nguyen, "Conductive Concrete for Smart Cities Applications," 2019 AEIT International Annual Conference (AEIT), Florence, Italy, 2019, pp. 1-5, doi: 10.23919/AEIT.2019.8893415, which is hereby incorporated by reference herein in its entirety.

The conductive concrete compositions disclosed herein can include a cement (which can also referred to as a "cementitious hydraulic binder") such as Portland cement of various types, water, aggregates such as coarse and/or fine aggregates, supplementary materials (for example, supplementary cementitious materials), and/or conductive materials. Coarse aggregates can be normal weight aggregate (which may be referred to as "natural aggregate"), lightweight aggregate, a combination of the same, among other types of coarse aggregates. Inclusion of lightweight aggregates as a whole or partial substitution for heavier, normal weight aggregates can result in reduced weight. Such reduced weight can be important to offset weight from conductive materials (for example, steel fibers) added to some embodiments of the disclosed compositions. Minimizing total weight of the composition can be advantageous in various structural applications, for example, to reduce gravity and/or lateral loading conditions and/or to allow different structural arrangements (for example, the ability to have increased spans due to reduced weight of the composition). Non-limiting examples of normal weight aggregate are limestone, granite, and basalt. Such normal weight aggregates can have a nominal size of about 2 mm, about 3 mm, about 4 mm, about 5 mm, about 6 mm, about 7 mm, about 8 mm, about 9 mm, about 10 mm, about 11 mm, about 12 mm, about 13 mm, about 14 mm, about 15 mm, about 16 mm, about 17 mm, about 18 mm, about 19 mm, or about 20 mm, or any value between any of these values, or any range bounded by any combination of these values. Non-limiting example of lightweight aggregates are expanded clay or shale, and pumice. Such lightweight aggregates can have a nominal size of between about 1 mm and about 20 mm, between about 2 mm and about 18 mm, between about 3 mm and about 16 mm, between about 4 mm and about 14 mm, between about 5 mm and about 12 mm, between about 6 mm and about 10 mm, between about 1 mm and about 10 mm, between about 2 mm and about 10 mm, between about 3 mm and about 10 mm, between about 4 mm and about 10 mm, or between about 4 mm and about 8 mm. Non-limiting examples of fine aggregate include sand, gravel, among others.

As described elsewhere herein, in some embodiments, the disclosed conductive concrete compositions can include one or more supplementary materials, for example, in addition to cement and aggregates. Such supplementary materials can be supplementary cementitious materials, for example. Some embodiments of the disclosed conductive concrete compositions include one or more of fly ash, silica fume, and GGBS. Some embodiments of the disclosed conductive concrete compositions include GGBS but do not include fly ash and/or do not include silica fume.

As described elsewhere herein, in some embodiments, the disclosed conductive concrete compositions can include one or more conductive materials. Such conductive materials can include fibers such as metallic fibers (for example, steel fibers) and/or carbon products. The fibers can have aspect ratios between 40 and 100, for example, and the fibers can have lengths of about 10 mm, about 15 mm, about 20 mm, about 25 mm, about 30 mm, about 35 mm, about 40 mm, about 45 mm, about 50 mm, about 55 mm, about 60 mm, about 65 mm, about 70 mm, about 75 mm, or about 80 mm, or any value between any of these values, or any range bounded by any combination of these values. Inclusion of fibers (for example, steel fibers) can increase impact resistance and/or post-cracking behavior of the hardened concrete composition. Steel fibers can be utilized to provide electromagnetic shielding via reflection and/or absorption. Such carbon products can include coke powder, graphite, carbon filaments, among others. Some embodiments of the disclosed conductive concrete compositions include metallic fibers (for example, steel fibers) and one or more carbon products such as any of those described above.

In some embodiments, a conductive concrete composition comprises between about 0% and about 40% by weight of cement, between about 0% and about 20% by weight of one or more supplementary materials (such as fly ash, silica fume, and/or GGBS), between about 0% and about 50% by weight of normal weight aggregate, between about 0% and about 50% by weight of lightweight aggregate, between about 0% and about 40% by weight of fine aggregate, and between about 0% and about 40% by weight of conductive materials (such as steel fibers and graphite). In some embodiments, the conductive concrete composition comprises between about 5% and about 35% by weight of cement, between about 5% and about 15% by weight of one or more supplementary materials (such as fly ash, silica fume, and/or GGBS), between about 5% and about 45% by weight of normal weight aggregate, between about 5% and about 45% by weight of lightweight aggregate, between about 5% and about 35% by weight of fine aggregate, and between about 5% and about 35% by weight of conductive materials (such as steel fibers and graphite). In some embodiments, the conductive concrete composition comprises between about 10% and about 30% by weight of cement, between about 10% and about 15% by weight of one or more supplementary materials (such as fly ash, silica fume, and/or GGBS), between about 10% and about 40% by weight of normal weight aggregate, between about 10% and about 40% by weight of lightweight aggregate, between about 10% and about 30% by weight of fine aggregate, and between about 10% and about 30% by weight of conductive materials (such as steel fibers and graphite). In some embodiments, the conductive concrete composition comprises between about 15% and about 25% by weight of cement, between about 15% and about 20% by weight of one or more supplementary materials (such as fly ash, silica fume, and/or GGBS), between about 15% and about 35% by weight of normal weight aggregate, between about 15% and about 35% by weight of lightweight aggregate, between about 15% and about 25% by weight of fine aggregate, and between about 15% and about 25% by weight of conductive materials (such as steel fibers and graphite). In some embodiments, the conductive concrete composition comprises between about 20% and about 25% by weight of cement, between about 15% and about 20% by weight of one or more supplementary materials (such as fly ash, silica fume, and/or GGBS), between about 20% and about 30% by weight of normal weight aggregate, between about 20% and about 30% by weight of lightweight aggregate, between about 20% and about 25% by weight of fine aggregate, and between about 15% and about 20% by weight of conductive materials (such as steel fibers and graphite).

In some embodiments, the conductive concrete composition comprises between about 5% and about 30% by weight of cement, between about 0% and about 15% by weight of one or more supplementary materials (such as fly ash, silica fume, and/or GGBS), between about 5% and about 45% by weight of normal weight aggregate, between about 5% and about 45% by weight of lightweight aggregate, between about 10% and about 30% by weight of fine aggregate, and between about 0% and about 40% by weight of conductive materials (such as steel fibers and graphite). In some embodiments, the conductive concrete composition comprises between about 9% and about 19% by weight of cement, between about 0% and about 10% by weight of one or more supplementary materials (such as fly ash, silica fume, and/or GGBS), between about 0% and about 40% by weight of natural or normal weight aggregate, between 0% and 40% by weight of lightweight aggregate, between about 15% and about 25% by weight of fine aggregate, and between about 0% and about 30% by weight of conductive materials (such as steel fibers and graphite). In some embodiments, the conductive concrete composition comprises between about 0% and about 25% by weight of carbon products (for example, carbon graphite). In some embodiments, the conductive concrete composition comprises between about 1% and about 5% by weight of fibers (for example, steel fibers). In some embodiments, the conductive concrete composition can comprise between about 9% and about 19% by weight of cement, between about 0% and about 10% by weight of one or more supplementary materials (such as fly ash, silica fume, and/or GGBS), between at least about 0.5% and about 40% by weight of natural or normal weight aggregate, between at least about 0.5% and 40% by weight of lightweight aggregate, between about 15% and about 25% by weight of fine aggregate, and between at least about 0.5% and about 30% by weight of conductive materials (such as steel fibers and graphite).

In some embodiments, a conductive concrete composition comprises between about 0% and about 40% by weight of cement, between about 0% and about 20% by weight of one or more supplementary materials (such as fly ash, silica fume, and/or GGBS), between about 0% and about 50% by weight of normal weight aggregate, between about 0% and about 50% by weight of lightweight aggregate, between 5% and 40% by weight of fine aggregate, between about 0% and about 30% by weight of carbon graphite products, and between about 1% and about 5% by weight of steel fibers.

In some embodiments, a conductive concrete composition comprises between about 5% and about 35% by weight of cement, between about 5% and about 15% by weight of one or more supplementary materials (such as fly ash, silica fume, and/or GGBS), between about 5% and about 45% by weight of normal weight aggregate, between about 5% and about 45% by weight of lightweight aggregate, between 10% and 35% by weight of fine aggregate, between about 5% and about 25% by weight of carbon graphite products, and between about 1% and about 4% by weight of steel fibers. In some embodiments, a conductive concrete composition comprises between about 10% and about 30% by weight of cement, between about 10% and about 15% by weight of one or more supplementary materials (such as fly ash, silica fume, and/or GGBS), between about 10% and about 40% by weight of normal weight aggregate, between about 10% and about 40% by weight of lightweight aggregate, between 15% and 30% by weight of fine aggregate, between about 10% and about 20% by weight of carbon graphite products, and about 2% by weight of steel fibers. In some embodiments, a conductive concrete composition comprises between about 15% and about 25% by weight of cement, between about 10% and about 15% by weight of one or more supplementary materials (such as fly ash, silica fume, and/or GGBS), between about 15% and about 35% by weight of normal weight aggregate, between about 15% and about 35% by weight of lightweight aggregate, between 20% and 25% by weight of fine aggregate, between about 15% and about 20% by weight of carbon graphite products, and about 2% by weight of steel fiber. In some embodiments, a conductive concrete composition comprises between about 9% and about 19% by weight of cement, between about 0% and about 10% by weight of one or more supplementary materials (such as fly ash, silica fume, and/or GGBS), between about 0% and about 40% by weight of normal weight aggregate, between about 0% and about 40% by weight of lightweight aggregate, between about 15% and about 25% by weight of fine aggregate, between about 0% and about 25% by weight of carbon graphite products, and about 2% by weight of steel fiber.

In some embodiments, a conductive concrete composition comprises greater than about 0% by weight of cement (for example, greater than about 1%, greater than about 5%, greater than about 10%, greater than about 15%, greater than about 20%, greater than about 30%, or greater than about 35% by weight of cementer) but less than about 50% by weight of cement (for example, less than about 45%, less than about 40%, less than about 35%, less than about 30%, less than about 25%, or less than about 20% by weight of cement).

In some embodiments, a conductive concrete composition comprises greater than about 0% by weight of normal weight aggregate (for example, greater than about 1%, greater than about 5%, greater than about 10%, greater than about 15%, greater than about 20%, greater than about 30%, or greater than about 35% by weight of normal weight aggregate) but less than about 60% by weight of normal weight aggregate (for example, less than about 55%, less than about 50%, less than about 45%, less than about 40%, less than about 35%, less than about 30%, less than about 25%, less than about 20%, less than about 15%, or less than about 10% by weight of normal weight aggregate).

In some embodiments, a conductive concrete composition comprises greater than about 0% by weight of lightweight aggregate (for example, greater than about 1%, greater than about 5%, greater than about 10%, greater than about 15%, greater than about 20%, greater than about 30%, or greater than about 35% by weight of lightweight aggregate) but less than about 60% by weight of lightweight aggregate (for example, less than about 55%, less than about 50%, less than about 45%, less than about 40%, less than about 35%, less than about 30%, less than about 25%, less than about 20%, less than about 15%, or less than about 10% by weight of lightweight aggregate).

In some embodiments, a conductive concrete composition comprises greater than about 0% by weight of fine aggregate (for example, greater than about 1%, greater than about 5%, greater than about 10%, greater than about 15%, greater than about 20%, greater than about 30%, or greater than about 35% by weight of fine aggregate) but less than about 60% by weight of fine aggregate (for example, less than about 55%, less than about 50%, less than about 45%, less than about 40%, less than about 35%, less than about 30%, less than about 25%, less than about 20%, less than about 15%, or less than about 10% by weight of fine aggregate).

In some embodiments, a conductive concrete composition comprises greater than about 0% by weight of supplementary materials (for example, greater than about 1%, greater than about 2%, greater than about 3%, greater than about 4%, greater than about 5%, greater than about 6%, greater than about 7%, greater than about 8%, greater than about 9%, or greater than about 10% by weight of supplementary materials) but less than about 30% by weight of supplementary materials (for example, less than about 25%, less than about 20%, less than about 19%, less than about 18%, less than about 17%, less than about 16%, less than about 15%, less than about 14%, less than about 13%, less than about 12%, less than about 11%, or less than about 10% by weight of supplementary materials). Such supplementary materials can include one or more of fly ash, silica fume, and GGBS. In some embodiments, such supplementary materials include GGBS but do not include fly ash and/or do not include silica fume.

In some embodiments, a conductive concrete composition comprises greater than about 0% by weight of one or more carbon products (for example, greater than about 1%, greater than about 2%, greater than about 3%, greater than about 4%, greater than about 5%, greater than about 6%, greater than about 7%, greater than about 8%, greater than about 9%, greater than about 10%, greater than about 11%, greater than about 12%, greater than about 13%, greater than about 14%, greater than about 15%, greater than about 16%, greater than about 17%, greater than about 18%, greater than about 19%, or greater than about 20% by weight of one or more carbon products) but less than about 30% by weight of one or more carbon products (for example, less than about 29%, less than about 28%, less than about 27%, less than about 26%, less than about 25%, less than about 24%, less than about 23%, less than about 22%, less than about 21%, less than about 20%, less than about 19%, less than about 18%, less than about 17%, less than about 16%, less than about 15%, less than about 14%, less than about 13%, less than about 12%, less than about 11%, or less than about 10% by weight of one or more carbon products). Such one or more carbon products can comprise carbon graphite products, for example.

Some embodiments of the conductive concrete compositions disclosed herein include GGBS but do not include fly ash and/or do not include silica fume. The inclusion of GGBS (for example, in place of fly ash and/or silica fume) along with conductive materials such as one or more carbon products and/or steel fibers, provides low resistance in the compositions, which can enhance the ability of the concrete to absorb electromagnetic waves for electromagnetic shielding applications as discussed above.

Structural Systems for Electromagnetic Shielding Applications

Various embodiments of concrete structures and/or structural components are described herein. Any of the concrete structures and/or structural components described herein can be made of a conductive concrete composition such as any of those described herein, or can be made of alternative compositions.

FIG. 1 illustrates a schematic plan (for example, top) view of a structure 100 that can be used to enclose and protect critical infrastructure facilities from electromagnetic interference (EMI) and electromagnetic pulse (EMP) events. As discussed above, electromagnetic waves arising from EMI or EMP events can harm critical infrastructure facilities or components and prevent the same from being able to continually provide electricity, data storage, and/or communication. Structure 100 can be used to enclose and protect vulnerable critical infrastructure facilities from electromagnetic waves that may attempt to penetrate thought the structure 100, or alternatively, structure 100 can be used to enclose devices and/or components that generate potentially harmful electromagnetic waves and prevent such generated electromagnetic waves from exiting the structure 100.

As illustrated, the structure 100 can include one or more or a plurality of walls 104 and one or more or a plurality of columns 102. Each of the one or more walls 104 can be secured to the columns 102 as described in more detail below. Each or any of walls 104 and/or columns 102 can be made of concrete. Each or any of walls 104 and/or columns 102 can be pre-manufactured ("precast") in a facility prior to assembly at a construction site. Precast concrete construction can be significantly advantageous for many infrastructure applications because precast concrete units can be efficiently and accurately prepared in a facility prior to deliver to a construction site and such precast units can greatly simplify construction at the construction sites. As a result, precast concrete is valuable for construction of critical infrastructures and facilities. In some embodiments, the walls 104 are precast concrete panels.

Each or any of walls 104 and/or columns 102 can be made of a conductive concrete composition, such as any of the conductive concrete compositions discussed herein. As discussed, such conductive concrete compositions can provide electromagnetic shielding as well as other benefits and therefore can be advantageously incorporated into structure 100 (and structural components thereof) in order to prevent electromagnetic waves from passing through (either in or out of) the structure 100. Despite the electromagnetic shielding provided by finished (for example, hardened) conductive concrete compositions, it has been found that electromagnetic waves can "leak" in some cases through connection joints and/or regions in concrete structures, especially in precast manufacturing where precast units are secured together at a construction site. For example, ends of precast panels and/or columns are often joined via various securement techniques and methods at connection joints. However, such connection joints are susceptible to allowing leakage of electromagnetic waves. Various aspects of the present disclosure describe structural components and configurations that can prevent or minimize the ability of electromagnetic waves to pass through such connection joints.

While FIG. 1 illustrates the structure 100 having four walls 104 and four columns 102, an alternative amount of walls 104 and/or columns 102 can form structure 100. Structure 100 can have one, two, three, four, five, six, seven, or eight or more walls 104 and/or can have one, two, three, four, five, six, seven, or eight or more columns 102. The number of walls 104 can be equal to the number of columns 102 in some cases. The schematic plan view of structure 100 is meant to be illustrative of an exemplary embodiment and to provide a framework for various aspects of the disclosure which describe structural components, systems, and methods for securing portions of the structure 100 and preventing or minimizing leakage of electromagnetic waves through such portions of the structure 100.

Figure 2A:
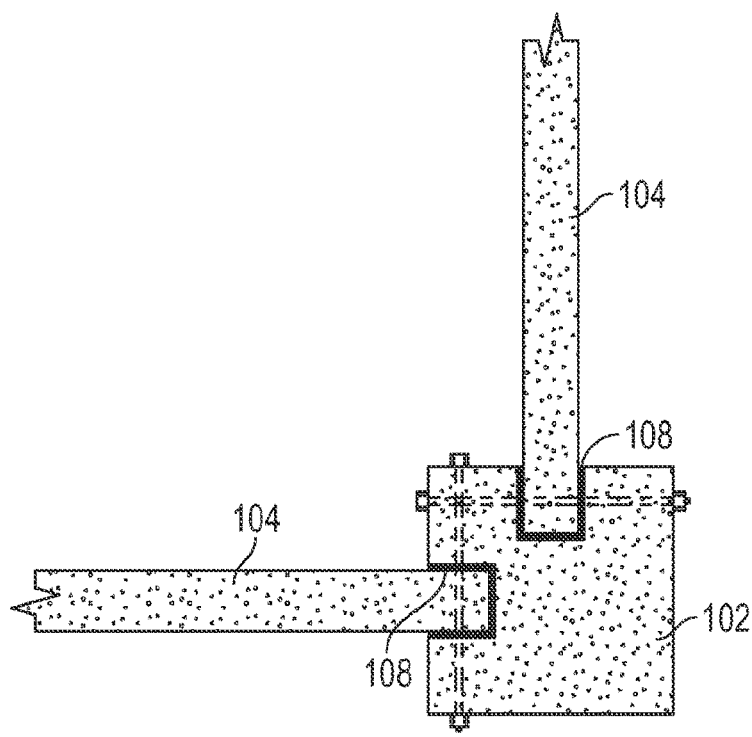
FIG. 2A illustrates an enlarged view of a portion of the structure shown in FIG. 1 in accordance with aspects of this disclosure.
Figure 2B:
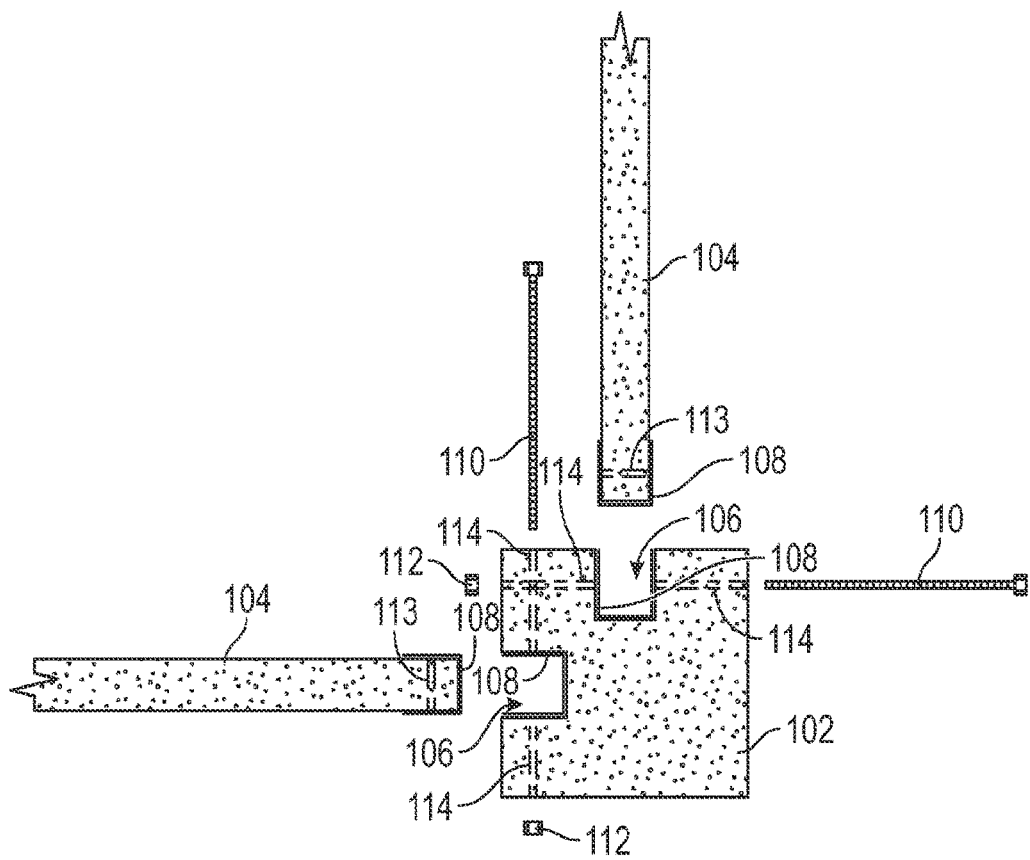
FIG. 2B illustrates an exploded view of the portion of the structure shown in FIG. 2A in accordance with aspects of this disclosure.

FIG. 2A illustrates an enlarged view of a portion of the structure 100 shown in FIG. 1. More specifically, FIG. 2A illustrates an enlarged view of ends of two walls 104 secured to portions of a column 102. FIG. 2B illustrates an exploded view of that which is shown in FIG. 2A to better illustrate various structural components described further below. As discussed above, the walls 104 can be precast concrete units, such as precast panels. As also discussed above, the columns 102 can be precast concrete units.

Advantageously, the walls 104 and/or columns 102 can include interlocking portions that can join at connection joints/regions of the structure 100 and minimize the potential for leakage of electromagnetic waves through such connection joints/regions. Such interlocking portions can cooperate to alter a passageway by which electromagnetic waves must travel in order to pass through such connection joints/regions in the structure 100. For example, such interlocking portions can cooperate to form a tortuous and/or non-linear passage by which electromagnetic waves must travel in order to pass through the connection joints/regions of the structure 100. By manipulating an exit/entrance passageway for electromagnetic waves in such manner, the interlocking portions increase the chance that such waves will be absorbed by portions of the walls 104 and/or columns 102 and/or reflected within and/or reflected away from portions of the structure 100.

Use of the phrase "interlocking portion" is not intended to mean that the corresponding interlocking portions of the walls 104 and columns 102 must be "locked." Rather, such phrase is used to describe portions of the walls 104 and columns 102 that interact, cooperate, and/or integrate together to form a connection joint and/or region of the structure 100.

Walls 104 can include an interlocking portion at ends thereof which can join or link with interlocking portions in columns 102 to minimize such leakage potential while forming a robust connection. The interlocking portion of the walls 104 can be an end or ends of the walls 104. The column 102 can have one or more or a plurality of channels 106 that can be recessed from sides or surfaces of the column 102 and which can serve as an interlocking portion of the column 102. The column 102 can include one, two, three, four, five, six, seven, or eight or more channels 106 that can be recessed from sides or surfaces of the column 102. Depending on the configuration and/or location of the column 102 within the structure 100, the column 102 can have a number of channels 106 corresponding to a number of walls 104 intended to be secured thereto. Thus, while columns 102 are illustrated as having two channels 106 (each recessed from adjacent and perpendicular sides/surfaces of the column 102), an alternative number of channels 106 is possible. The channels 106 can extend along all or a portion of a height of the column 102. The channels 106 can have a partially square or partially rectangular cross-section, among others. The channels 106 can have a cross-section that corresponds to and/or matches a cross-section or portion of a cross-section of ends of walls 104. The channels 106 can be sized and/or shaped to receive ends of walls 104 or a portion thereof. As shown, each of the channels 106 can include (for example, be defined by) three sides. As also shown, two of such three sides can be parallel to each other and perpendicular to a remaining (third) side, and such remaining (third) side can be parallel to a side or surface of the column 102 from which the channel 106 is recessed. However, channels 106 can be defined by an alternative number of sides, for example, two, four, five, six, seven, or eight or more sides. The number of sides defining the channels 106 can be altered to correspond with sides of portions of ends of the walls 104 so that the ends of the walls 104 can be received within the channels 106. While the columns 102 are described as having channels 106 recessed from sides or surfaces thereof, columns 102 can have or more keys extending from sides or surfaces of the columns 102 which define and/or are defined by channels 106 (such as keys 260, 270 described below with reference to column 202).

Advantageously, channels 106 can greatly reduce the chance for leakage of electromagnetic waves around the joints/regions where the walls 104 and columns 102 connect. Such connection and/or positioning of the ends of walls 104 within the channels 106 of the columns 102 provide significant advantages over some traditional techniques of securing walls to columns where the ends of the walls are secured and/or positioned against flat (for example, non-recessed) sides of the columns and allow electromagnetic waves to exit/enter around the connection joint/region in a linear manner.

With reference to FIG. 2B, one or more plates 108 can be positioned within and/or secured to the column 102 and/or walls 104 at and/or near the connection joints/regions. For example, as shown, one or more plates 108 can be positioned within the channels 106 along one or more sides which define the channels 106. The plates 108 can have a shape and/or cross-section that corresponds to a shape and/or cross-section of the channels 106. Additionally or alternatively, the plates 108 can have a shape and/or cross-section that corresponds to a shape and/or cross-section of the walls 104 and/or a portion thereof (such as ends of walls 104 or portions of ends of walls 104). As another example, the plates 108 can have a U-shape having two sides parallel to each other and perpendicular to a third side. The plates 108 can have one, two, three, four, five, six, seven, or eight or more sides. The plates 108 can extend along a height of the column 102, channel 106 and/or wall 104 or can extend along a portion of the height of the column 102, channel 106 and/or wall 104. The plates 108 can advantageously prevent or minimize leakage of electromagnetic waves through the connection joints/regions of the structure 100. The plates 108 can be metallic. For example, the plates 108 can comprise steel. In some cases, each of the plates 108 shown in FIGS. 2A-2B comprises a plurality of individual straight plates that are joined together. For example, each of plates 108 illustrated in FIG. 2B can be a unitary plate including three straight plates. In some cases, each of such three straight plates are integrally formed into each of plates 108.

During assembly of the structure 100 (for example, on a construction site), ends of the walls 104 can be inserted into the channels 106 of the columns 102. Where plates 108 are utilized, such plates 108 can be positioned within the channels 106 as shown. As shown in FIGS. 2A-2B, such plates 108 can be sandwiched between ends of the walls 104 (or portions thereof) and the channels 106 of column 102 (or portions thereof).

As shown, the walls 104 and/or columns 102 can include one or more or a plurality of holes 113, 114 extending through portions thereof. Such holes 113, 114 can be pre-drilled, for example, in a facility where the walls 104 are pre-manufactured (for example, precast) or can be drilled on-site. The walls 104 can include one or more or a plurality of holes 113 extending through widths of the walls 104 and/or proximate ends of the walls 104 and such holes 113 can be spaced (for example, vertically) along a height of the walls 104. For example, the walls 104 can include one, two, three, four, five, six, seven, eight, nine, ten, eleven, or twelve or more holes 113. As another example, the walls 104 can include a certain number of holes 113 per a given portion of the height of the walls 104, such as one, two, or three holes 113 per foot of height of the walls 104. The number, spacing (for example, vertical), and/or arrangement of holes 113 optionally included in walls 104 can be varied as desired depending on the configuration of the walls 104 and/or other structural component(s) of the structure (for example, columns 102).

The columns 102 can include one or more or a plurality of holes 114 proximate ends or sides of the columns 102 and such holes 114 can be spaced (for example, vertically) along a height of the columns 102. For example, the columns 102 can include one, two, three, four, five, six, seven, eight, nine, ten, eleven, or twelve or more holes 114. As another example, the columns 102 can include a certain number of holes 114 per a given portion of the height of the columns 102, such as one, two, or three holes 114 per foot of height of the columns 102. The number, spacing (for example, vertical), and/or arrangement of holes 114 optionally included in columns 102 can be varied as desired depending on the configuration of the columns 102 and/or other structural component(s) of the structure (for example, walls 104). The holes 114 can extend through portions of the column 102 adjacent to channels 106 as shown.

Advantageously, the holes 113, 114 can allow the walls 104 and columns 102 to be secured using one or more or a plurality of fasteners, such as fasteners 110, and/or one or more or a plurality of nuts 112. The number of fasteners 110 and/or nuts 112 can be identical to the number of holes 113 and/or holes 114. Additionally, the spacing (for example, vertical) and/or arrangement of the fasteners 110 and/or nuts 112 can be varied to correspond with the holes 113 and/or holes 114 which are described above. The fasteners 110 can be threaded rods, for example. The fasteners 110 and/or nuts 112 can be made of a metallic material, such as steel.

During assembly, ends of the walls 104 can be positioned within channels 106 of columns 102 and the holes 103 can be aligned with holes 114. Subsequent to such positioning and alignment, fasteners 110 can be positioned through the holes 113, 114 and nuts 112 can be secured to ends of the fasteners 110. Where the plates 108 are utilized in the connection joint/region, such plates 108 can include one or more or a plurality of holes that can align with the holes 113 and holes 114 when the plates are positioned within the channels 106. The plates 108 can include a plurality of holes can be spaced (for example, vertically) along a height of the plates 108, which as described above, can extend along the height of the channels 106, column 102, and/or walls 104 or portions of the height of the channels 106, column 102, and/or walls 104. The number, spacing (for example, vertical), and/or arrangement of holes in the plates 108 optionally included in plates 108 can be varied as desired depending on the number, spacing, and/or arrangement of the holes 113 and/or holes 114 of the walls 104 and/or columns 102. Such holes in the plates 108 can allow the fasteners 110 to extend therethrough and secure the walls 104, the plates 108, and the columns 102 as shown. As discussed above, each of plates 108 can be formed of one or more individual (for example, straight plates). In such cases, ones of the individual plates can include a plurality of holes that align with the holes 113, 114 when the plates 108 are positioned within the channels 106. For example, where each of the plates 108 are formed from three straight plates, two parallel ones of the three straight plates can each include a plurality of holes that that align with the holes 113, 114 when the plates 108 are positioned within the channels 106.

While the structure 100 has been described above as being formed by connecting portions of walls 104 to columns 102, the structure 100 can be additionally or alternatively formed by connecting ends of walls 104 together and the features of columns 102 can be incorporated into ends of the walls 104. For example, the structure 100 can be formed, at least in part, by connecting multiple walls 104 together along sides of the structure (for example, one of the four sides of structure 100 schematically illustrated in FIG. 1) and one of the joined ends of the walls 104 can incorporate the channel 106 as described above to receive an end of the corresponding joined wall 104. Thus, while the connection joints/regions of the structure 100 was described and shown with respect to "column" 102, such column 102 could alternatively be a wall, like wall 104 which incorporates the channel 106. Further, in some cases, two walls 104 can be joined in the manner described above and can have equal widths at the connection joint/regions thereof such that interior and exterior surfaces of the connection joint/region of the structure 100 are flush with one another (for example, along the same plane(s)).

Figure 3:
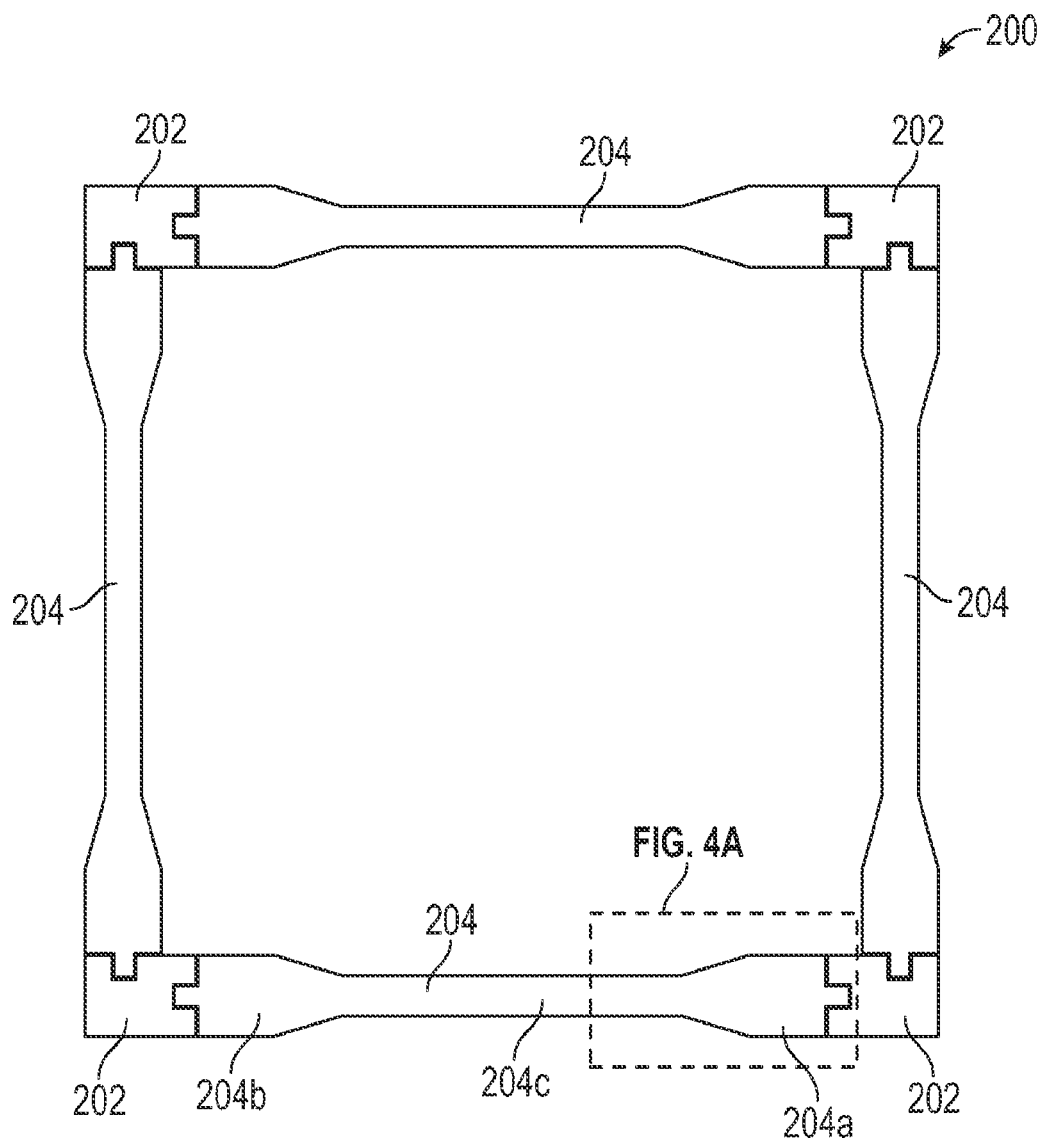
FIG. 3 illustrates a plan view of an exemplary structure in accordance with aspects of this disclosure.

FIG. 3 illustrates a schematic plan (for example, top) view of another structure 200 that can be used to enclose and protect critical infrastructure facilities from electromagnetic interference (EMI) and electromagnetic pulse (EMP) events. As discussed above, electromagnetic waves arising from EMI or EMP events can harm critical infrastructure facilities or components and prevent the same from being able to continually provide electricity, data storage, and/or communication. Similar to structure 100, structure 200 can be used to enclose and protect vulnerable critical infrastructure facilities from electromagnetic waves that may attempt to penetrate through the structure 200, or alternatively, structure 200 can be used to enclose devices and/or components and prevent electromagnetic waves generated from such devices and/or components from exiting the structure 200.

As illustrated, the structure 200 can include one or more or a plurality of walls 204 and one or more or a plurality of columns 202. Although the term "column" is used for element 202, the features and/or aspects described with reference to column 202 below are equally applicable to a different type of structural element. For example, the features and/or aspects described with reference to column 202 below can be incorporated into a wall (for example, an end of a wall) that can be similar to wall 204 but which incorporates an interlocking portion such as that discussed below with respect to column 202. Each of the one or more walls 204 can be secured to the columns 202 as described in more detail below. Each or any of walls 204 and/or columns 202 can be made of concrete. Each or any of walls 204 and/or columns 202 can be pre-manufactured ("precast") in a facility prior to assembly at a construction site as discussed above with reference to walls 104 and columns 102. In some embodiments, the walls 204 are precast concrete panels.

Similar to that discussed with reference to walls 104 and columns 102, each or any of walls 204 and/or columns 202 can be made of a conductive concrete composition, such as any of the conductive concrete compositions discussed herein. As discussed previously, such conductive concrete compositions provide electromagnetic shielding as well as other benefits and therefore can be advantageously incorporated into structure 200 (and structural components thereof) in order to prevent electromagnetic waves from passing through (either in or out of) the structure 200. Despite the electromagnetic shielding provided by finished (for example, hardened) conductive concrete compositions, it has been found that electromagnetic waves can "leak" in some cases through connection joints and/or regions in concrete structures, especially in precast manufacturing where precast units are secured together at a construction site. For example, ends of precast panels and/or columns are often joined via various securement techniques and methods at connection joints. However, such connection joints are susceptible to allowing leakage of electromagnetic waves. Various aspects of FIGS. 3-6D describe structural components and configurations that can prevent or minimize the ability of electromagnetic waves to pass through such connection joints.

While FIG. 3 illustrates the structure 200 having four walls 204 and four columns 202, an alternative amount of walls 204 and/or columns 202 can form structure 200. Structure 200 can have one, two, three, four, five, six, seven, or eight or more walls 204 and/or can have one, two, three, four, five, six, seven, or eight or more columns 202. The number of walls 204 can be equal to the number of columns 202 in some cases. The schematic plan view of structure 200 is meant to be illustrative of an exemplary embodiment and to provide a framework for various aspects of the disclosure which describe structural components, systems, and methods for securing portions of the structure 200 and preventing or minimizing leakage of electromagnetic waves through such portions of the structure 200.

Figure 4A:
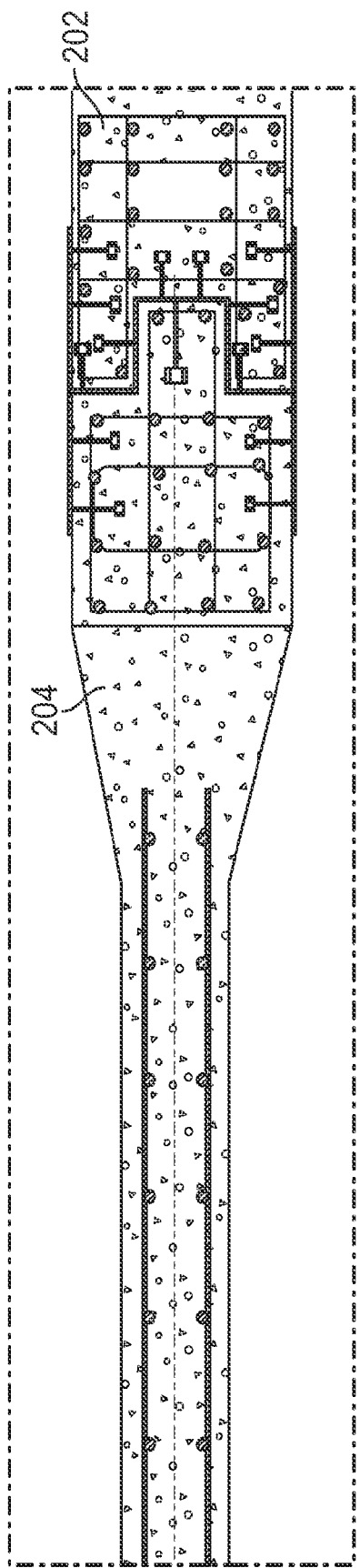
FIG. 4A illustrates an enlarged view of a portion of the structure shown in FIG. 3 in accordance with aspects of this disclosure.
Figure 4B:
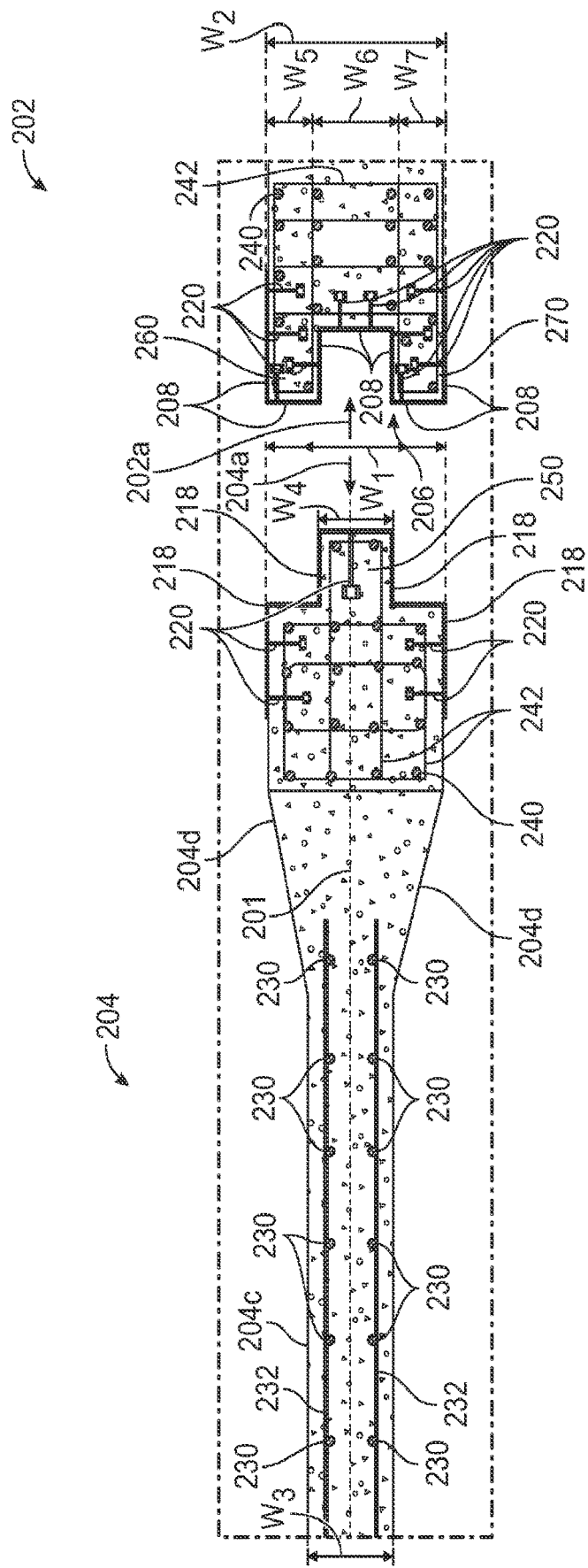
FIG. 4B illustrates an exploded view of the portion of the structure shown in FIG. 4A in accordance with aspects of this disclosure.

FIG. 4A illustrates an enlarged view of a portion of the structure 200 shown in FIG. 3. More specifically, FIG. 4A illustrates an enlarged view of an end 204a of a wall 204 and a portion of a column 202. FIG. 4B illustrates an exploded view of that which is shown in FIG. 4A to better illustrate various structural components described further below. As discussed above, the walls 204 can be precast concrete units, such as precast panels. As also discussed above, the columns 202 can be precast concrete units.

Advantageously, similar to the walls 104 and columns 102 of structure 100, the walls 204 and/or columns 202 can include interlocking portions that can join at connection joints/regions of the structure 200 and minimize the potential for leakage of electromagnetic waves through such connection joints/regions. Such interlocking portions can cooperate to alter a passageway by which electromagnetic waves must travel in order to pass through such connection joints/regions in the structure 200. For example, such interlocking portions can cooperate to form a tortuous and/or non-linear passage by which electromagnetic waves must travel in order to pass through the connection joints/regions of the structure 200. By manipulating an exit/entrance passageway for electromagnetic waves in such manner, the interlocking portions increase the chance that such waves will be absorbed by portions of the walls 204 and/or columns 202 and/or reflected within and/or reflected away from portions of the structure 200. The phrase "interlocking portion" is not intended to mean that the corresponding interlocking portions of the walls 204 and columns 202 must be "locked." Rather, such phrase is used to describe portions of the walls 204 and columns 202 that interact, cooperate, and/or integrate together to form a connection joint and/or region of the structure 200.

Walls 204 can include an interlocking portion at ends thereof which can join or link with interlocking portions in columns 202 to minimize such leakage potential while forming a robust connection. For example, with reference to FIG. 4B, the wall 204 can include a key 250 which can protrude outward from a portion of the wall 204 that can interact with and/or engage one or more of keys 260, 270 which can extend outward from a portion of the column 202 and/or channel 206 (also referred to herein as a "gap") which can define and/or be defined by the keys 260, 270.

As shown in FIG. 4B, the key 250 can extend outward from the end 204a of wall 204 and can be positioned between and/or spaced from opposite (for example, interior and exterior) sides of the end 204a and/or wall 204. As shown, the key 250 can extend outward from a middle portion of the end 204a and/or along an axis 201 extending along a center of the wall 204 and/or end 204a along a length of the wall 204. The key 250 can extend along all or a portion of a height of the wall 204 and/or end 204a. While the figures illustrate wall 204 having one key 250, an alternative number of keys is possible, for example, depending on the configuration and/or desired connection with the column 202.

The key 250 can have a partially square or partially rectangular cross-section, among others. The key 250 can have a cross-section that corresponds to and/or matches a cross-section or portion of a cross-section of the end 202a of the column 202 (for example, the channel 206). The key 250 can be sized and/or shaped to fit within the gap or channel 206 between the keys 260, 270. As shown, the key 250 can include (for example, be defined by) three sides. As also shown, two of such three sides can be parallel to each other and perpendicular to a remaining (third) side, and such remaining (third) side can be parallel to a side or surface of the end 204a of the wall 204. However, key 250 can be defined by an alternative number of sides, for example, two, four, five, six, seven, or eight or more sides. The number of sides defining the key 250 can be altered to correspond with the shape and/or configuration of the keys 260, 270 and/or channel 206 so that the key 250 can be received within the channel 206.

As also shown, the keys 260, 270 can extend outward from end 202a of the column 202 along opposite (for example, interior and exterior) sides of the column 202 and/or can be spaced from one another by the gap or channel 206. The gap or channel 206 can be sized and/or shaped to receive all or a portion of the key 250 therewithin. The keys 260, 270 and/or channel 206 can extend along all or a portion of a height of the column 202 and/or 202a. While FIGS. 4A-4B illustrate a portion of the column 202 and keys 260, 270 and channel 206, as shown in FIG. 3, column 202 can have another pair of keys 260, 270 and another channel 206 on a different end or portion of the column 202 for example, in order to connect to more than one wall 204. The column 202 can include one, two, three, four, five, six, seven, or eight or more pairs of keys 260, 270 and/or one, two, three, four, five, six, seven, or eight or more channels 206. Depending on the configuration and/or location of the column 202 within the structure 200, the column 202 can have a number of keys 260, 270 and/or channels 206 corresponding to a number of walls 204 intended to be secured thereto.

The keys 260, 270 and/or channel 206 can have a partially square or partially rectangular cross-section, among others. The keys 260, 270 and/or channel 206 can have a cross-section that corresponds to and/or matches a cross-section or portion of a cross-section of the end 204a of the wall 204 or portions thereof (for example, the key 250). The key 260, 270 and/or channel 206 can be sized and/or shaped to form a dovetail connection with key 250 of wall 204, for example.

As shown, channel 206 can include (for example, be defined by) three sides. As also shown, two of such three sides can be parallel to each other and perpendicular to a remaining (third) side, and such remaining (third) side can be parallel to a side or surface of the column 202 from which the channel 206 is recessed. However, channels 206 can be defined by an alternative number of sides, for example, two, four, five, six, seven, or eight or more sides. The number of sides defining the channel 206 can be altered to correspond with sides or portions of key 250 so that key 250 can be received within the channels 206 and/or can engage with keys 260, 270.

Advantageously, the key 250, keys 260, 270, and/or channel 206 can greatly reduce the chance for leakage of electromagnetic waves around the joints/regions where the walls 204 and columns 202 connect. Such connection of the ends of walls 204 with the columns 202 provide significant advantages over some traditional techniques of securing walls to columns where the ends of the walls are secured against flat (for example, non-recessed) sides of the columns and allow electromagnetic waves to exit/enter around the connection joint/region in a linear manner. The key 250, keys 260, 270, and/or channel 206 can cooperate to alter a passageway by which electromagnetic waves travel in order to pass between end 204a and end 202a, especially where the wall 204 and column 202 are formed from a conductive concrete composition that absorbs and/or prevents transmission of such waves through other portions of the structure 200 (such as any of the conductive concrete compositions discussed herein).

With reference to FIGS. 4A-4B, any or each of walls 204 can include ends 204a, 204b and a length extending between ends 204a, 204b. Additionally, any or each of walls 204 can include an intermediate portion 204c between the ends 204a, 204b. In some embodiments, the ends 204a, 204b have a width $W_1$ that is not equal to a width $W_3$ of the intermediate portion 204c. For example, the width $W_1$ can be greater or less than the width $W_3$. In some embodiments, width $W_3$ is less than width $W_1$ and the walls 204 gradually transition from width $W_3$ at a transition portion 204d of the wall 204. Such transition portion 204d can gradually (for example, linearly) increase in width from the width $W_3$ to the width $W_1$ (see FIG. 4B). With continued reference to FIG. 4B, the key 250 can have width $W_4$ that is less than width $W_1$ and/or less than, equal to, or greater than width $W_3$. Key 260 can have a width $W_5$, key 270 can have a width $W_7$, and channel or gap 206 can have a width $W_6$. $W_4$ can be equal to, less than, or greater than any or all of widths $W_5$, $W_6$, and/or $W_7$. Width $W_5$ can be equal to, less than, or greater than any or all of widths $W_6$, $W_7$, and/or $W_4$. Width $W_5$ can be less than $W_2$ as shown. Width $W_6$ can be equal to, less than, or greater than any or all of widths $W_5$, $W_7$, and/or $W_4$. Width $W_6$ can be less than $W_2$ as shown. Width $W_7$ can be equal to, less than, or greater than any or all of widths $W_6$, $W_5$, and/or $W_4$. Width $W_7$ can be less than $W_2$ as shown.

As discussed above, the walls 204 and/or columns 202 can comprise concrete. Additionally, the walls 204 and/or columns can include various vertical and/or horizontal reinforcement bars (for example, rebar). With reference to FIG. 4B, the wall 204 can include one or more or a plurality of vertical reinforcement bars 230, which can be (horizontally) spaced apart at any desirable and/or required spacing to achieve sufficient strength for the wall 204 as is known to one of skill in the art. Such one or more or a plurality of vertical reinforcement bars 230 can extend along a height of the wall 204 or a portion thereof. Such vertical reinforcement bars 230 can be spaced apart from one another along a length of the wall 204 or a portion thereof. As an example, the wall 204 can include one, two, three, four, five, six, seven, eight, nine, or ten or more vertical reinforcement bars 230 along a height of the wall 204 or a portion thereof. In some embodiments, the walls 204 and/or columns 202 comprise a conductive concrete composition, such as any of those described herein which can include steel fibers. In such embodiments, the walls 204 and/or columns 202 can include less vertical and/or horizontal reinforcement than that which would be required for similar structural components that were made of conventional concrete compositions (for example, non-conductive concrete compositions).

Additionally or alternatively, the wall 204 can include one or more or a plurality of horizontal reinforcement bars 232, which can be (vertically) spaced apart at any desirable and/or required spacing to achieve sufficient strength for the wall 204 as is known to one of skill in the art. Such one or more or a plurality of horizontal reinforcement bars 232 can extend along a length of the wall 204 or a portion thereof. Such horizontal reinforcement bars 232 can be spaced apart from one another along a height of the wall 204 or a portion thereof. As an example, the wall 204 can include one, two, three, four, five, six, seven, eight, nine, or ten or more horizontal reinforcement bars 232 along a height of the wall 204 or a portion thereof. As shown in FIGS. 4A-4B, in some embodiments, the wall 204 can include one or more or a plurality of pairs of horizontal reinforcement bars 232 which can be (vertically) spaced apart along the height of the wall 204 and each of the pair of horizontal reinforcement bars 232 are spaced from each other along the same horizontal (cross-section) plane.

With continued reference to FIG. 4B, the end 204a and/or the column 202 (or end 202a of column 202) can include one or more or a plurality of vertical reinforcement bars 240 and/or one or more of a plurality of horizontal reinforcement bars or hoops 242. Such reinforcement bars 240 and/or bars or hoops 242 can be positioned within or at least partially within any of keys 250, 260, 270 as shown. For example, in some embodiments, any or all of the keys 250, 260, 270 can include one, two, three, four, five, or six or more vertical reinforcement bars 240 and/or at least one horizontal reinforcement hoop 242.

The number, spacing, and/or arrangement of vertical reinforcement bars 240 can be varied to achieve sufficient strength and capacity of the walls 204 (or end 204a) and/or column 202 (or end 202a) as is known to one of skill in the art. The one or more or a plurality of vertical reinforcement bars 240 can extend along a height of the wall 204 or a portion thereof. Such vertical reinforcement bars 240 can be spaced apart from one another and/or in an arrangement proximate the end 204a of the wall 204 and/or the end 202a of column 202. As an example, the end 204a of the wall 204 and/or the end 202a of the column 202 can include one, two, three, four, five, six, seven, eight, nine, ten, eleven, twelve, thirteen, fourteen, fifteen, or sixteen or more vertical reinforcement bars 240 along a height of the wall 204 or a portion thereof. The one or more or a plurality of horizontal reinforcement bars or hoops 242 can extend along a dimension of the end 204a of the wall 204 or a portion thereof. Such horizontal reinforcement bars or hoops 242 can be vertically spaced apart from one another along a height of the end 204a of the wall 204 and/or a height of the end 202a of column 202. As shown in FIGS. 4A-4B, in some embodiments, the end 204a of the wall 204 can include a plurality of horizontal reinforcement hoops 242 (such as one, two, three, four, five, six, seven, or eight or more hoops 242 along the same horizontal (cross-section) plane. Such horizontal reinforcement bars or hoops 242 can surround and/or enclose various ones of the plurality of vertical reinforcement bars 240 as is known to one of skill in the art.

With reference to FIG. 4B, one or more plates 208, 218 can be positioned secured to the column 202 and/or walls 204 at and/or near the connection joints/regions (for example, at or near ends 202a, 204a). For example, one or more plates 208 can be positioned around the key 260, 270, within channel or gap 206, and/or on sides of the column 202 at or near the connection joint/regions. Additionally or alternatively, one or more plates 218 can be positioned around the key 250 and/or on sides of the wall 204 and/or end 204a at or near the connection joint/regions. Plates 208 and 218 can each be formed by a single unitary plate or by a plurality of straight plates that are connected and/or placed adjacent to one another. In some embodiments, plate 208 comprises a unitary plate that has a shape and/or cross-section that corresponds to a shape and/or cross-section of the end 202a, keys 260, 270, channel 206, and/or sides of the column 202 adjacent the end 202a (see FIG. 4B). In some embodiments, plate 218 comprises a unitary plate that has a shape and/or cross-section that corresponds to a shape and/or cross-section of the end 204a, key 250, and/or sides of the wall 204 adjacent the end 204a (see FIGS. 4B and 6B).

Any of plate 208, 218 can have one or more sides, such as one, two, three, four, five, six, seven, or eight or more sides. In some embodiments, each of the one or more sides of the plates 208, 218 are straight and join at right angles to one another. Plate 208 can extend along a height of the column 202, end 202a, key 260, 270, and/or channel 206, or can extend along a portion of the height of the column 202, end 202a, key 260, 270, and/or channel 206. Plate 218 can extend along a height of the wall 204, end 204a, and/or key 250, or can extend along a portion of the height of the wall 204, end 204a, and/or key 250. Similar to that discussed above with reference to plates 108, the plates 208, 218 can advantageously prevent or minimize leakage of electromagnetic waves through the connection joints/regions of the structure 200. The plates 208, 218 can be metallic. For example, the plates 208, 218 can comprise steel.

As shown in FIG. 4B, the plate 208 can be secured to the column 202, end 202a, keys 260, 270, channel 206, and/or to sides of the column 202 at or near the connection joint/regions or portions thereof via one or more anchors 220, such as one, two, three, four, five, six, seven, or eight or more anchors 220. Such anchors 220 can be embedded into the concrete column 202 and/or end 202a during the manufacturing process (for example, where the columns 202 are precast concrete units). Similarly, the plate 218 can be secured to the wall 204, end 204a, key 250, and/or to sides of the wall 204 at or near the connection joint/regions or portions thereof via one or more anchors 220, such as one, two, three, four, five, six, seven, or eight or more anchors 220. Such anchors 220 can be embedded into the concrete wall 204 and/or end 204a during the manufacturing process (for example, where the walls 204 are precast concrete units). Such anchors 220 can extend outward from surfaces of the plate 208 (for example, perpendicularly). As shown, the anchors 220 can be T-shaped, each having a wider dimensioned head at an end thereof. Such shape can help prevent pull-out of the anchors 220 and thereby prevent the plates 208, 218 from being removed from the walls 204 and/or columns 202. The anchors 220 can be made of a metallic material. For example, the anchors 220 can comprise steel.

During assembly of the structure 200 (for example, on a construction site), key 250 can be placed and/or positioned to engage keys 260, 270, for example, placed within the channel 206 that can define and/or can be defined by the keys 260, 270. Where plates 208, 218 are utilized, such plates 208, 218 can be sandwiched between the keys 250, 260, 270, channel 206, and/or other portions of the end 204a and end 202a as shown in FIG. 4A.

FIGS. 4A-4B illustrate one embodiment of a cross-section for the wall 204, for example, at an intermediate portion 204c, transition portion 204d, and end 204a of the wall 204. FIGS. 5A-5D illustrate alternative configurations for cross-sections of the wall 204. More specifically, FIGS. 5A-5D illustrate configurations for cross-sections of the wall 204 which provide increased electromagnetic wave absorption characteristics.

Figure 5A:
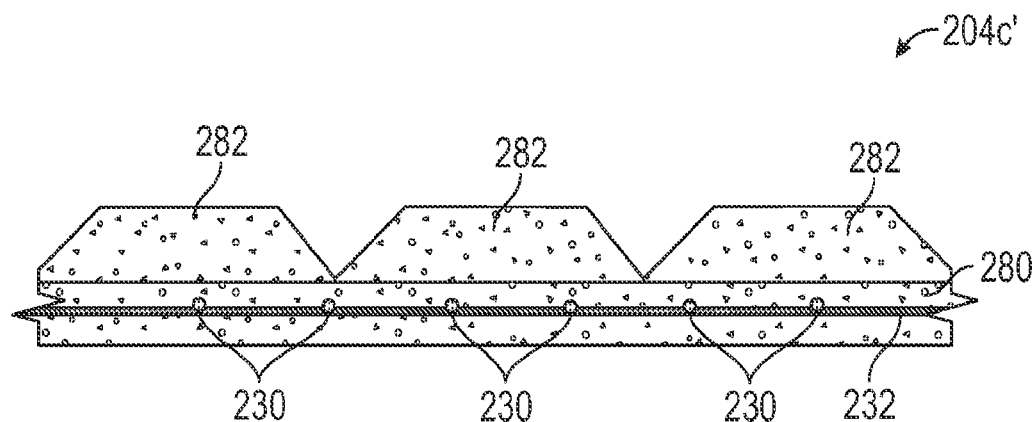
FIGS. 5A-5D illustrate various embodiments of cross-sections of portions of a wall that can be utilized in the structure shown in FIGS. 3-4B in accordance with aspects of this disclosure.
Figure 5B:
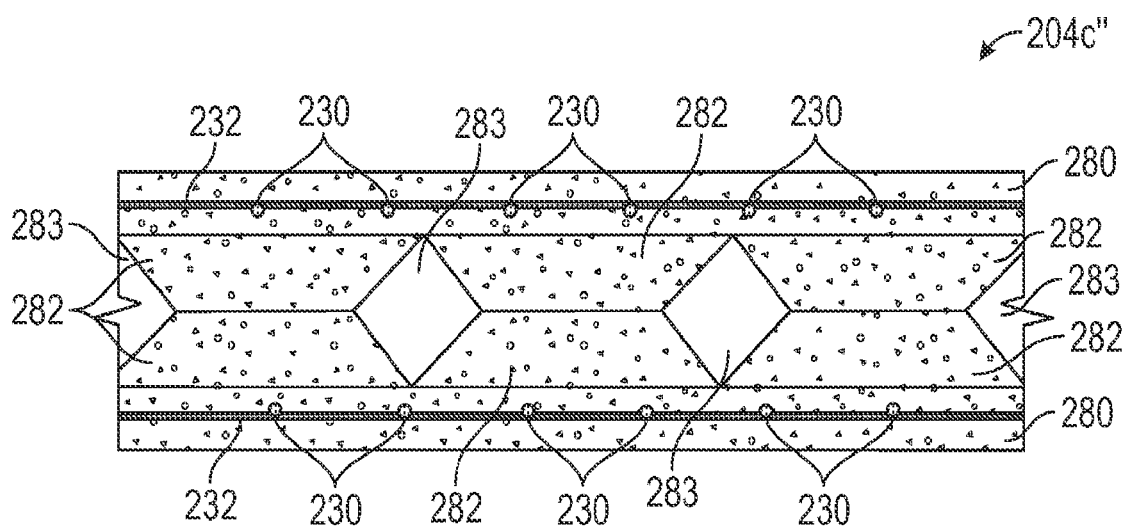

FIG. 5A illustrates an alternative embodiment for an intermediate portion 204c' for wall 204 which includes a wall section 280 (which can comprise concrete), vertical reinforcement bars 230, and horizontal reinforcement bars 232, the number, spacing, and/or arrangement of which can be the same as that discussed above and is not repeated here for the sake of brevity. As illustrated, one or more or a plurality of protrusions 282 can be formed adjacent to a side (such as an interior side) of the wall section 280. The protrusions 282 can be arranged in an array and/or pattern that extends the height and/or length of the wall section 280 (or the wall 204) or a portion of the height and/or length thereof. Protrusions 282 can comprise a variety of cross-sections, such as trapezoidal (as depicted), among others. Protrusions 282 can comprise concrete, similar to the wall section 280. FIG. 5B illustrates another embodiment for an intermediate portion 204" for the wall 204. As shown, intermediate portion 204c" has a cross-section comprising two of intermediate portions 204c' stacked adjacent to one another such that pairs of the arrays/patterns of protrusions 282 face and contact one another (producing gaps 283) and two wall sections 280 are positioned exterior thereto.

Figure 5C:
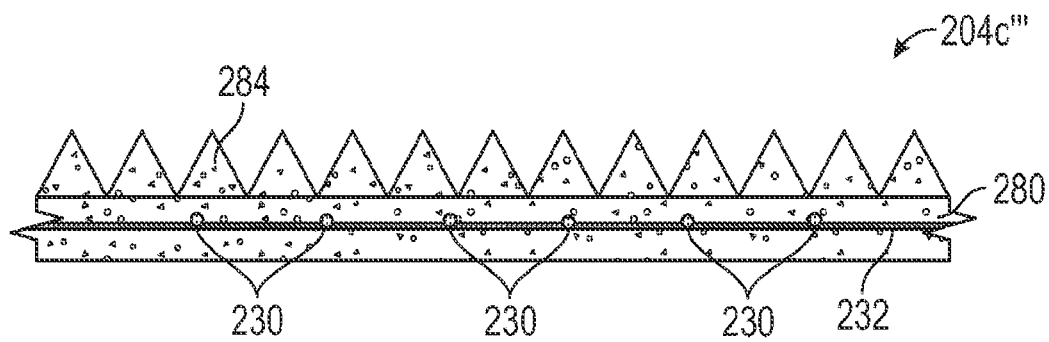
Figure 5D:
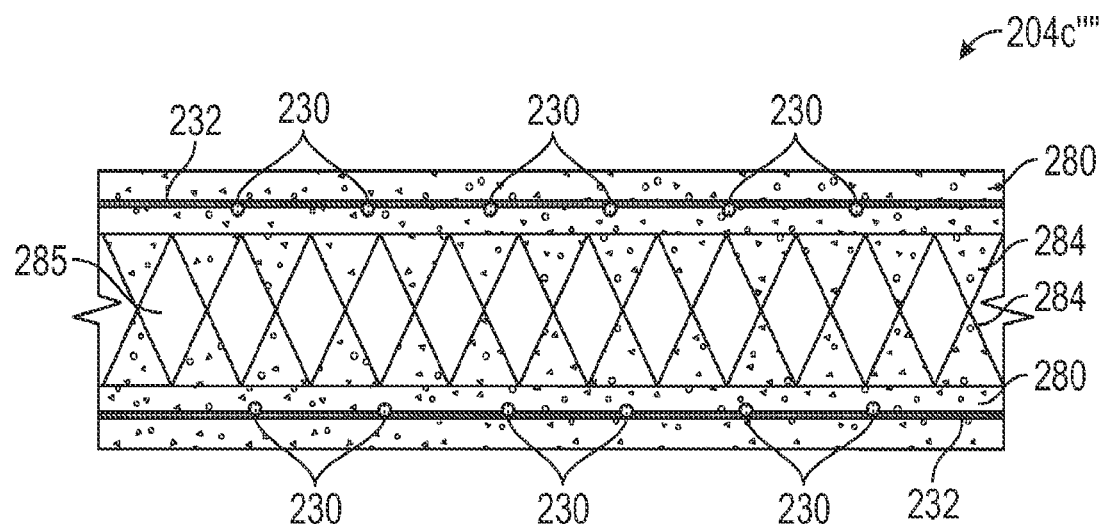

FIG. 5C illustrates an intermediate portion 204c''' which is identical to intermediate portion 204c' except that the protrusions 284 comprise a triangular cross-sectional shape instead of a trapezoidal cross-sectional shape. Such protrusion 282 can be partially conical when viewed in a perspective view, for example. FIG. 5D illustrates another embodiment for an intermediate portion 204c''' for the wall 204. As shown, intermediate portion 204c'''' has a cross-section comprising two of intermediate portions 204c''' stacked adjacent to one another such that pairs of the arrays/patterns of protrusions 284 face and contact one another (producing gaps 285) and two wall sections 280 are positioned exterior thereto. The various cross-sections illustrated in FIGS. 5A-5D can advantageously provide increased electromagnetic wave absorption characteristics. For example, the shape and configuration of the protrusions 282 and/or protrusions 284 can maximize absorption of electromagnetic wave that may be present inside structure 200 which may try to escape, and/or that may be present outside the structure 200 which may try to infiltrate the structure 200. As another example, sloping surfaces of the various shapes and configuration (for example, of the conical cross-sectional shapes) provide multiple surfaces for reflection of electromagnetic waves, thereby improving shielding effectiveness of walls or portions thereof which incorporate such shapes and configurations. The shape, configuration, among other details of such protrusions 282, 284 can be similar or identical to that described within T. Khalid, L. Albasha, N. Qaddoumi, and S. Yehia, "Feasibility Study of Using Electrically Conductive Concrete for Electromagnetic Shielding Applications as a Substitute for Carbon-Laced Polyurethane Absorbers in Anechoic Chambers," in *IEEE Transactions on Antennas and Propagation*, vol. 65, no. 5, pp. 2428-2435, May 2017, doi: 10.1109/TAP.2017.2670538, which is hereby incorporated by reference herein in its entirety.

Figure 6A:
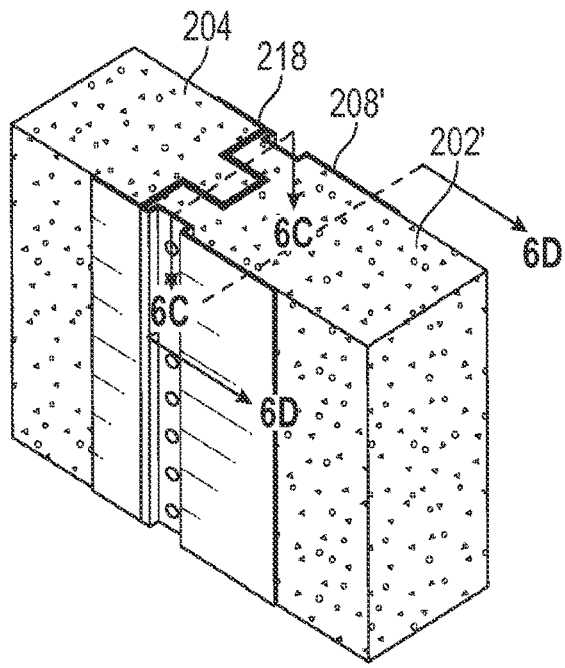
FIG. 6A illustrates a perspective elevation view of an embodiment of a portion of a structure in accordance with aspects of this disclosure.
Figure 6B:
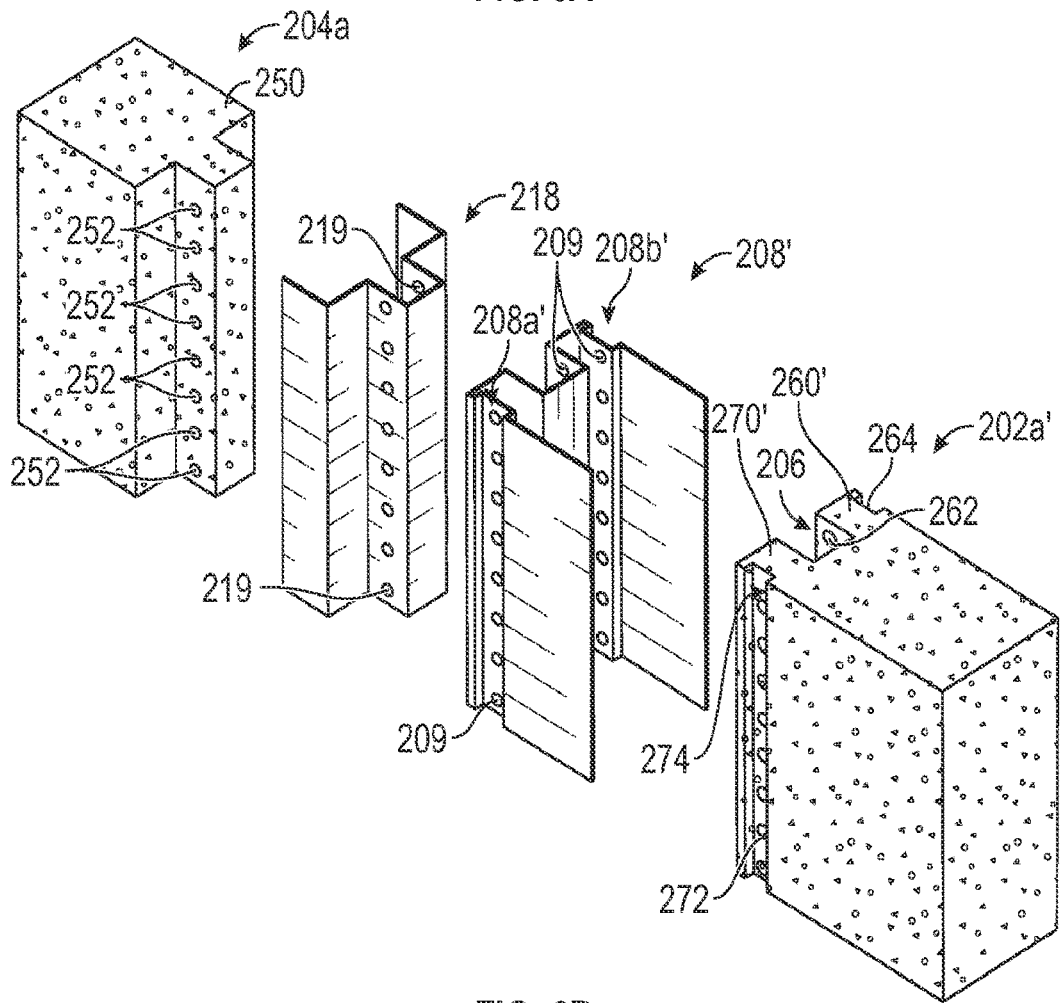
FIG. 6B illustrates an exploded view of the perspective elevation view of the portion of the structure shown in FIG. 6A in accordance with aspects of this disclosure.
Figure 6D:
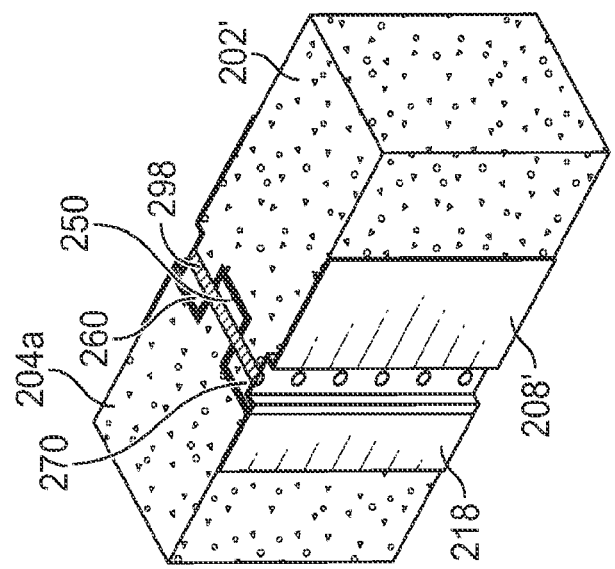
FIGS. 6C-6D illustrate cross-sections taken through portions of the structure shown in FIG. 6A in accordance with aspects of this disclosure.
Figure 6C:
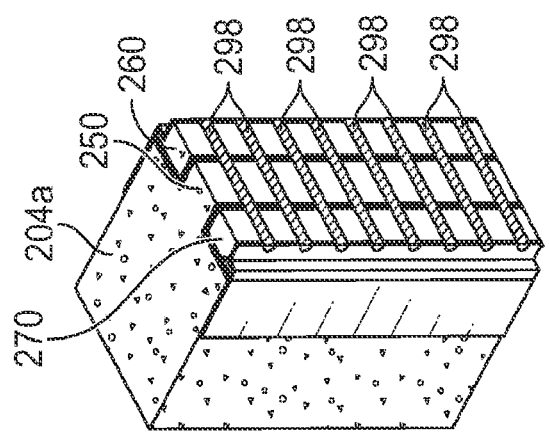

FIG. 6A illustrates a perspective elevation view of portions of the wall 204 and another embodiment for a column 202' and FIG. 6B illustrates an exploded perspective view of that which is illustrated in FIG. 6A. FIGS. 6C-6C illustrate perspective elevation views of vertical and horizontal cross-sections taken through the portions of the wall 204 and column 202' shown in FIG. 6A. Column 202' is identical to column 202 described above except that column 202' has channels 264 and 274 recessed from sides of keys 260', 270' (respectively) as described below. Keys 260', 270' are identical to keys 260, 270 described above with reference to column 202 except with respect to the channels 264, 274. Plate 208' is identical to plate 208 described above except that plate 208' includes channels 208a', 208b' that are sized and shaped to conform to the size and shape of the channels 264, 274. Despite these differences, FIGS. 6A-6D nonetheless illustrate (via additional views) how the wall 204 and columns 202, 202' can engage (for example, connect) at connection joints/regions of the structure 200. Accordingly, the discussion that occurs below with reference to FIGS. 6A-6D is applicable to the components discussed above with reference to FIGS. 3-5D. For example, by way of non-limiting example, end 204a and end 202a can be secured by the one or more fasteners 298 via one or more holes in each of keys 250, 260, 270, plates 218, 208 just as described below with respect to keys 250, 260', and 270', and plates 218, 208'.

As illustrated in FIGS. 6A-6B, wall 204 can connect to column 202' by inserting key 250 between keys 260, 270, for example, within channel 206. Where plates 218, 208' are utilized, such plates 218, 208' can be positioned within the channels 206 and/or around the keys 250, 260, 270 and/or sides at or near ends 204a, 202a' or portions thereof. As shown, such plates 218, 208' can be sandwiched between end 204a of the wall 204 (or portions thereof) and the end 202a' of column 202' (or portions thereof).

As shown, in some embodiments, the keys 250, 260', 270' include one or more or a plurality of holes 252, 262, 272 extending through portions thereof. Such holes 252, 262, 272 can be pre-drilled, for example, in a facility where the walls 204 are pre-manufactured (for example, precast) or can be drilled on-site. The key 250 can include one or more or a plurality of holes 252 extending through a width thereof (for example, width $W_4$ shown in FIG. 4B) and such holes 252 can be spaced (for example, vertically) along a height of the key 250. For example, the key 250 can include one, two, three, four, five, six, seven, eight, nine, ten, eleven, or twelve or more holes 252. As another example, the key 250 can include a certain number of holes 252 per a given portion of the height of the key 250, such as one, two, or three holes 252 per foot of height of the key 250. The number, spacing (for example, vertical), and/or arrangement of holes 252 optionally included in key 250 can be varied as desired depending on the configuration of the key 250 and/or other structural component(s) of the structure (for example, the number, spacing, and/or arrange of holes 262, 272 in keys 260', 270'). Each of keys 260, 270 can include one or more or a plurality of holes 262, 272 extending through widths thereof (for example, width $W_5$, $W_7$ shown in FIG. 4B) and such holes 262, 272 can be spaced (for example, vertically) along heights of the keys 260, 270. For example, the keys 260', 270' can include one, two, three, four, five, six, seven, eight, nine, ten, eleven, or twelve or more holes 262, 272. As another example, the keys 260', 270' can include a certain number of holes 262, 272 per a given portion of the height of the keys 260', 270', such as one, two, or three holes 262, 272 per foot of height of the keys 260', 270'. The number, spacing (for example, vertical), and/or arrangement of holes 262, 272 optionally included in keys 260', 270' can be varied as desired depending on the configuration of the keys 260', 270' and/or other structural component(s) of the structure 200 (for example, the number, spacing, and/or arrange of holes 252 in key 250). The holes 262, 272 can extend through the keys 260', 270' into channel 206 as shown.

Advantageously, the holes 252, 262, 272 can allow the wall 204 and column 202' to be secured using one or more or a plurality of fasteners, such as fasteners 298 (see FIGS. 6C-6D), and/or one or more or a plurality of nuts (which can be identical to nuts 112 discussed above). The number of fasteners 298 and/or nuts can be identical to the number of holes 252, 262, and/or 272. Additionally, the spacing (for example, vertical) and/or arrangement of the fasteners 298 and/or nuts can be varied to correspond with the holes 252, 262, and/or 272 which are described above. The fasteners 298 can be threaded rods, for example. The fasteners 298 and/or nuts can be made of a metallic material, such as steel.

During assembly, key 250 can be positioned within channel 206 between and/or adjacent to keys 260', 270' and the holes 252 can be aligned with holes 262, 272. Subsequent to such positioning and alignment, fasteners 298 can be positioned through the holes 252, 262, 272 and nuts can be secured to ends of the fasteners 298. Where the plates 218, 208' are utilized in the connection joint/region, such plates 218, 208' can include one or more or a plurality of holes 219, 209 that can align with the holes 252, 262, 272 when the plates 218, 208' are positioned around the keys 250, 260', 270', channel 206, and/or sides at or near the ends 204a, 202a'. The plates 218, 208' can include a plurality of holes 219, 209 that can be spaced (for example, vertically) along a height of the plates 218, 208'. The plates 218, 208' can extend along the height of the channel 206, keys 250, 260', 270', and/or sides at or near the end 204a, 202a'. The number, spacing (for example, vertical), and/or arrangement of holes 219, 209 optionally included in plates 218, 208' can be varied as desired depending on the number, spacing, and/or arrangement of the holes 252, 262, 272. Such holes 219, 209 in the plates 218, 208' can allow the fasteners 298 to extend therethrough and secure the keys 250, 260, 270, plates 208', 218 and therefore the wall 204 and column 202 as shown.

Where incorporated, the recessed channels 264, 272 can advantageously provide a space for nuts and/or heads of the fasteners 298 to fit such that, when the keys 250, 260', 270' and plates 218, 208' are secured in the above-described manner, such nuts and/or heads do not protrude from exterior and/or interior surfaces and/or sides of the wall 204 and/or column 202'. In some embodiments, any or all of the channels 264, 272 comprise three sides, two of which are parallel to one another and perpendicular to a third side connecting the two other sides.

Although FIGS. 3-6D illustrate column 202, 202' having two keys 260, 270 (or keys 260', 270'), column 202, 202' can have an alternative number of keys that can engage with key 250. For example, in some variations, column 202, 202' has one key extending outward from a surface of the end 202a, 202a' that mates with a key extending outward from a surface of end 204a. Such keys can form a dovetail fit such that, when mated, create a flush surface or plane between parallel sides of the end 204a and end 202a, 202a', for example.

While the terms "wall" and "column" have been used to describe aspects of the disclosure, the disclosure is not so limited. For example, the connection details, arrangements, components, and/or techniques described herein can be implemented in other types of structural components in addition to walls and columns. For example, all of the connection details, arrangements, components, and/or techniques described herein can be implemented in floors, slabs, beams, or other structural components, such as precast concrete units.

Terminology

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), or all of the steps of any method or process so disclosed, may be combined in any combination, except combinations where at least some of such features or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only and are not intended to limit the scope of protection. Indeed, the novel methods and systems described herein may be embodied in a variety of other forms. Furthermore, various omissions, substitutions and changes in the form of the methods and systems described herein may be made. Those skilled in the art will appreciate that in some embodiments, the actual steps taken in the processes illustrated or disclosed may differ from those shown in the figures. Depending on the embodiment, certain of the steps described above may be removed, others may be added. For example, the actual steps or order of steps taken in the disclosed processes may differ from those shown in the figure. Depending on the embodiment, certain of the steps described above may be removed, others may be added. Furthermore, the features and attributes of the specific embodiments disclosed above may be combined in different ways to form additional embodiments, all of which fall within the scope of the present disclosure.

Although the present disclosure includes certain embodiments, examples and applications, it will be understood by those skilled in the art that the present disclosure extends beyond the specifically disclosed embodiments to other alternative embodiments or uses and obvious modifications and equivalents thereof, including embodiments which do not provide all of the features and advantages set forth herein. Accordingly, the scope of the present disclosure is not intended to be limited by the described embodiments, and may be defined by claims as presented herein or as presented in the future.

Conditional language, such as "can," "could," "might," or "may," unless specifically stated otherwise, or otherwise understood within the context as used, is generally intended to convey that certain embodiments include, while other embodiments do not include, certain features, elements, or steps. Thus, such conditional language is not generally intended to imply that features, elements, or steps are in any way required for one or more embodiments or that one or more embodiments necessarily include logic for deciding, with or without user input or prompting, whether these features, elements, or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Likewise the term "and/or" in reference to a list of two or more items, covers all of the following interpretations of the word: any one of the items in the list, all of the items in the list, and any combination of the items in the list. Further, the term "each," as used herein, in addition to having its ordinary meaning, can mean any subset of a set of elements to which the term "each" is applied. Additionally, the words "herein," "above," "below," and words of similar import, when used in this application, refer to this application as a whole and not to any particular portions of this application.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

What is claimed is:

1. A concrete structural system configured to provide electromagnetic shielding, the concrete structural system comprising:

a first structural component, the first structural component comprising a precast concrete panel including a first end, a second end opposite the first end, a first length extending between the first and second ends, a first height, and a first interlocking portion at the first end and extending along at least a portion of the first height;

a second structural component, the second structural component comprising concrete and further comprising a third end, a second height, and a second interlocking portion at the third end and extending along at least a portion of the second height;

a plurality of plates secured to and extending along the first and second interlocking portions and surrounding surfaces of the first and second interlocking portions;

wherein the first structural component and the second structural component are each comprised of a conductive concrete composition; and wherein the first interlocking portion of the first structural component and the second interlocking portion of the second structural component are configured to interlock with one another to minimize leakage of electromagnetic waves between the first end of the first structural component and the third end of the second structural component.

2. The concrete structural system of claim 1, wherein the plurality of plates extend along an entirety of the first and second heights of the first and second structural components.

3. The concrete structural system of claim 1, wherein the plurality of plates are secured to the first and second structural components with a plurality of anchors.

4. The concrete structural system of claim 1, wherein the first interlocking portion is defined along a portion of the first length of the first structural component.

5. The concrete structural system of claim 1, wherein the second interlocking portion comprises a channel configured to receive the first interlocking portion.

6. The concrete structural system of claim 1, wherein the second structural component is a column comprising a square cross-section.

7. The concrete structural system of claim 1, wherein the plurality of plates comprise steel.

8. The concrete structural system of claim 1, wherein the first structural component comprises a first side and a second side opposite the first side, the first and second sides extending between the first and second ends of the first structural component, and wherein the plurality of plates comprises a first plate that extends along a portion of said first side and a second plate that extends along a portion of said second side.

9. The concrete structural system of claim 8, wherein the first structural component comprises a rectangular cross-section.

10. The concrete structural system of claim 8, wherein the first structural component further comprises an end surface at the first end, said end surface being perpendicular to the first and second sides of the first structural component, and wherein the plurality of plates further comprises a third plate extending along said end surface and connected to the first and second plates.

11. The concrete structural system of claim 1, wherein:
the first interlocking portion of the first structural component comprises a first key extending outward from the first end and extending along the first height of the first structural component;
the second interlocking portion comprises a second key and a third key spaced from the second key by a gap, the second and third keys extending outward from the third end and extending along the second height of the second structural component; and
the first key is sized and shaped to fit within the gap between the second and third keys of the second structural component.

12. The concrete structural system of claim 11, wherein, when the first key is positioned within the gap, the second and third keys sandwich the first key.

13. The concrete structural system of claim 11, further comprising a plurality of rods and wherein:
the first key comprises a first plurality of openings extending through a first width of the first key, the first plurality of openings vertically spaced apart along the first height of the first structural component;
the second key comprises a second plurality of openings extending through a second width of the second key, the second plurality of openings vertically spaced apart along the second height of the second structural component;
the third key comprises a third plurality of openings extending through a third width of the third key, the third plurality of openings vertically spaced apart along the third height of the second structural component, the third plurality of openings aligned with the second plurality of openings;
the plurality of plates comprises a first plurality of plates and a second plurality of plates;
the first plurality of plates comprises a fourth height and a fourth plurality of openings vertically spaced apart along the fourth height;
the second plurality of plates comprises a fifth height and a fifth plurality of openings vertically spaced apart along the fifth height; and
when the first key is positioned within the gap between the second and third keys, the first plurality of openings align with the second, third, fourth, and fifth plurality of openings and the plurality of rods are configured to extend through the first, second, third, fourth, and fifth plurality of openings and secure the first key, second key, third key, and first and second plurality of plates to one another.

14. The concrete structural system of claim 11, further comprising a plurality of rods and wherein:
the first key comprises a first plurality of openings extending through a first width of the first key, the first plurality of openings vertically spaced apart along the first height of the first structural component;
the second key comprises a second plurality of openings extending through a second width of the second key, the second plurality of openings vertically spaced apart along the second height of the second structural component;
the third key comprises a third plurality of openings extending through a third width of the third key, the third plurality of openings vertically spaced apart along the second height of the second structural component, the third plurality of openings aligned with the second plurality of openings;
when the first key is positioned within the gap between the second and third keys, the first plurality of openings align with the second and third plurality of openings and the plurality of rods are configured to extend through the first, second, and third plurality of openings and secure the first key to the second and third keys.

15. The concrete structural system of claim 14, wherein the plurality of plates comprise a first plurality of plates secured to the first key and a second plurality of plates secured to the second and third keys, wherein the first plurality of plates are integrally formed, and wherein the second plurality of plates are integrally formed.

* * * * *